United States Patent
Oh et al.

(10) Patent No.: US 12,094,535 B2
(45) Date of Patent: Sep. 17, 2024

(54) NONVOLATILE MEMORY DEVICES FOR REDUCING DEGRADATION DUE TO DIFFERENCE OF THRESHOLD VOLTAGE DISTRIBUTIONS BETWEEN OUTER CELLS AND INNER CELLS

(71) Applicant: SAMSUNG ELECTRONICS CO., LTD., Suwon-si (KR)

(72) Inventors: Eun Chu Oh, Hwaseong-si (KR); Junyeong Seok, Seoul (KR); Younggul Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 17/810,777

(22) Filed: Jul. 5, 2022

(65) Prior Publication Data
US 2023/0197158 A1 Jun. 22, 2023

(30) Foreign Application Priority Data
Dec. 20, 2021 (KR) .................. 10-2021-0182556

(51) Int. Cl.
*G11C 16/10* (2006.01)
*G11C 11/56* (2006.01)
(Continued)

(52) U.S. Cl.
CPC .......... *G11C 16/10* (2013.01); *G11C 11/5628* (2013.01); *G11C 11/5642* (2013.01);
(Continued)

(58) Field of Classification Search
CPC . G11C 16/10; G11C 11/5628; G11C 16/0483; G11C 16/24; G11C 2211/5641
See application file for complete search history.

(56) References Cited

U.S. PATENT DOCUMENTS 7,808,822 B2  10/2010  Han
8,050,103 B2  11/2011  Kim et al.
(Continued)

FOREIGN PATENT DOCUMENTS

EP          3686892         7/2020
KR     10-2011-0001701      1/2011

OTHER PUBLICATIONS

Extended European search report dated Nov. 30, 2022 from the European Patent Office in corresponding European Patent Application No. 22181472.6.

*Primary Examiner* — Mushfique Siddique
(74) *Attorney, Agent, or Firm* — F. Chau & Associates, LLC

(57) ABSTRACT

A nonvolatile memory device includes a memory cell array and a control circuit. The memory cell array includes a plurality of word-lines, a plurality of memory cells provided in a plurality of channel holes and a word-line cut region extending in a first horizontal direction and dividing the word-lines into a plurality of memory blocks. A plurality of target memory cells coupled to each of the plurality of word-lines are grouped into outer cells and inner cells based on a location index of each of the plurality of memory cells. The control circuit controls a program operation on target memory cells coupled to a target word-line of the plurality of word-lines such that each of the outer cells stores a first number of bits and each of the inner cells stores a second number of bits. The second number is a natural number greater than the first number.

20 Claims, 34 Drawing Sheets

(51) Int. Cl.
  *G11C 16/04* (2006.01)
  *G11C 16/08* (2006.01)
  *G11C 16/24* (2006.01)
  *G11C 16/26* (2006.01)

(52) U.S. Cl.
  CPC ...... *G11C 11/5671* (2013.01); *G11C 16/0483* (2013.01); *G11C 16/08* (2013.01); *G11C 16/24* (2013.01); *G11C 16/26* (2013.01)

(56) References Cited

U.S. PATENT DOCUMENTS

| | | |
|---|---|---|
| 9,070,450 B2 | 6/2015 | Aritome |
| 9,496,038 B1 | 11/2016 | Kwak et al. |
| 10,431,313 B2 | 10/2019 | Zhang et al. |
| 10,541,031 B2 | 1/2020 | Dunga et al. |
| 2009/0046510 A1 | 2/2009 | Song et al. |
| 2009/0109745 A1 | 4/2009 | Aritome |
| 2017/0075757 A1* | 3/2017 | Im ................. G06F 11/1068 |
| 2018/0240527 A1* | 8/2018 | Zhang ............. G11C 16/3427 |
| 2019/0385681 A1* | 12/2019 | Yun ................. G11C 16/24 |
| 2020/0365213 A1* | 11/2020 | Jeon ................ G11C 16/32 |
| 2021/0124693 A1 | 4/2021 | Kim et al. |
| 2023/0041476 A1* | 2/2023 | Yang ............... G11C 16/3495 |
| 2023/0207017 A1* | 6/2023 | Oh .................. G11C 16/32 365/189.011 |

* cited by examiner

FIG. 13D

|     | E | P1 | P2 | P3 | P4 | P5 | P6 | P7 | P8 | P9 | P10 | P11 | P12 | P13 | P14 | P15 |
|-----|---|----|----|----|----|----|----|----|----|----|-----|-----|-----|-----|-----|-----|
| LSB | 1 | 0  | 0  | 0  | 1  | 1  | 0  | 0  | 0  | 0  | 0   | 1   | 1   | 1   | 1   | 1   |
| ESB | 1 | 1  | 1  | 0  | 0  | 0  | 0  | 1  | 1  | 0  | 0   | 0   | 0   | 1   | 1   | 1   |
| USB | 1 | 1  | 1  | 1  | 1  | 0  | 0  | 0  | 0  | 0  | 1   | 1   | 0   | 0   | 0   | 1   |
| MSB | 1 | 1  | 0  | 0  | 0  | 0  | 0  | 0  | 1  | 1  | 1   | 1   | 1   | 1   | 0   | 0   |

NONVOLATILE MEMORY DEVICES FOR REDUCING DEGRADATION DUE TO DIFFERENCE OF THRESHOLD VOLTAGE DISTRIBUTIONS BETWEEN OUTER CELLS AND INNER CELLS

CROSS-REFERENCE TO RELATED APPLICATIONS

This U.S. patent application claims priority under 35 USC § 119 to Korean Patent Application No. 10-2021-0182556, filed on Dec. 20, 2021 in the Korean Intellectual Property Office, the disclosure of which is incorporated by reference in its entirety herein.

1. TECHNICAL FIELD

Example embodiments generally relate to semiconductor integrated circuits, and more particularly to nonvolatile memory devices and storage devices including the same.

2. DISCUSSION OF THE RELATED ART

Semiconductor memory devices include a volatile memory and a nonvolatile memory. Data stored in the volatile memory may be lost after a power-off. Data stored in the nonvolatile memory are retained even after a power-off. A flash memory device is an example of the nonvolatile memory. A flash memory device has a mass storage capability, relatively high noise immunity, and performs operations with relatively little power. Therefore, flash memory devices are employed in various fields. For example, a mobile system such as a smart-phone, or a tablet personal computer (PC) may employ flash memory as a storage medium.

A three-dimensional (3D) memory device may be fabricated by stacking non-volatile memory cells onto a substrate. However, due to the stacking, data retention characteristic of some of the memory cells may become degraded.

SUMMARY

At least one example embodiment of the disclosure may provide a nonvolatile memory device with enhanced performance.

At least one example embodiment of the disclosure may provide a storage device with enhanced performance.

According to an example embodiment, a nonvolatile memory device includes a memory cell array and a control circuit. The memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks. The control circuit controls the memory cell array. A plurality of target memory cells coupled to an each of the plurality of word-lines are grouped into outer cells and inner cells based on a location index of each of the plurality of memory cells, and a distance between the outer cell and the word-line cut region is smaller than a distance between the inner cell and the word-line cut region. The control circuit controls performance of a program operation on target memory cells coupled to a target word-line of the plurality of word-lines such that each of the outer cells stores a first number of bits and each of the inner cells stores a second number of bits. The first number is a natural number greater than zero and the second number is a natural number greater than the first number. The control circuit adjusts levels of read voltages associated with a read operation performed on the target memory cell such that at least one of first threshold voltage distributions of the outer cells and at least one of second threshold voltage distributions of the inner cells are discriminated by a same read voltage.

According to an example embodiment, a storage device includes a nonvolatile memory device and a storage controller. The nonvolatile memory device includes a memory cell array which includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks. The storage controller groups a plurality of memory cells coupled to each of the plurality of word-lines into a first group of cells and a second groups of cells based on a location index and includes a program manager. The program manager controls performance of a program operation on target memory cells coupled to a target word-line of the plurality of word-lines such that each of the first group of cells stores a first number of bits and each of the second group of cells stores a second number of bits. The first number is a natural number greater than zero and the second number is a natural number greater than the first number. The nonvolatile memory device adjusts levels of read voltages associated with a read operation performed on the target memory cell such that at least one of first threshold voltage distributions of the first group of cells and at least one of second threshold voltage distributions of the second group of cells have a same read voltage.

According to an example embodiment, a nonvolatile memory device includes a memory cell array and a control circuit. The memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks. The control circuit controls the memory cell array. A plurality of target memory cells coupled to each of the plurality of word-lines are grouped into outer cells and inner cells based on a location index of each of the plurality of memory cells, and a distance between the outer cell and the word-line cut region is smaller than a distance between the inner cell and the word-line cut region. The control circuit controls performance of a program operation on target memory cells coupled to a target word-line of the plurality of word-lines such that each of the outer cells stores M bits and each of the inner cells stores (M+1) bits. M is a natural number greater than two. The control circuit adjusts levels of read voltages associated with a read operation performed on the target memory cell such that at least one of first threshold voltage distributions of the outer cells and at least one of second threshold voltage distributions of the inner cells are discriminated by a same read voltage.

Accordingly, the nonvolatile memory device and the storage device according to at least one example embodiment may groups memory cells coupled to a target word-lines into outer cells and inner cells based on a relative distance from a word-line cut region to the memory cells and program different number of bits in the outer cells and the inner cells. Therefore, the nonvolatile memory device and the storage device may reduce degradation due to difference of threshold voltage distributions between the outer cells and the inner cells.

BRIEF DESCRIPTION OF THE DRAWINGS

Illustrative, non-limiting example embodiments will be more clearly understood from the following detailed description in conjunction with the accompanying drawings.

FIG. 13D illustrates a table for explaining bit mapping for programming memory cells according to an example embodiment.

DETAILED DESCRIPTION OF THE EMBODIMENTS

Various example embodiments will be described more fully hereinafter with reference to the accompanying drawings, in which some example embodiments are shown.

Figure 1:
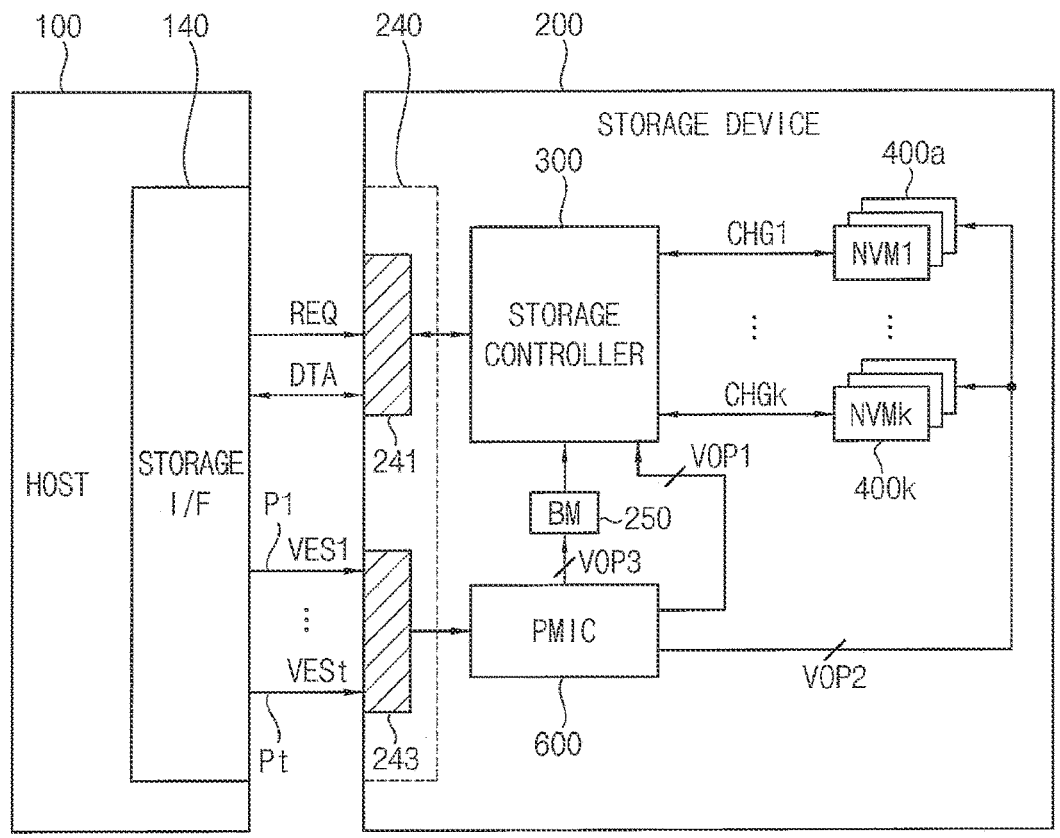
FIG. 1 is a block diagram illustrating a storage system according to an example embodiment.

FIG. 1 is a block diagram illustrating a storage system according to example an embodiment.

Referring to FIG. 1, a storage system 50 may include a host 100 (e.g., a host device) and a storage device 200. The host 100 may include a storage interface (I/F) 140 (e.g., an interface circuit).

The storage device 200 may be any kind of storage device.

The storage device 200 may include a storage controller 300, a plurality of nonvolatile memory devices 400a to 400k (where k is an integer greater than two), a power management integrated circuit (PMIC) 600 and a host interface 240. The host interface 240 may include a signal connector 241 and a power connector 243. The storage device 200 may further include a buffer memory BM 250.

The plurality of nonvolatile memory devices 400a to 400k may be used as a storage medium of the storage device 200. In some example embodiments, each of the plurality of nonvolatile memory devices 400a to 400k may include a flash memory or a vertical NAND memory device. The storage controller 300 may be coupled to the plurality of nonvolatile memory devices 400a to 400k through a plurality of channels CHG1 to CHGk, respectively.

The storage controller 300 may be configured to receive a request REQ (e.g., a request signal such as read or write request) from the host 100 and communicate data DTA with the host 100 through the signal connector 241. The storage controller 300 may write the data DTA to the plurality of nonvolatile memory devices 400a to 400k or read the data DTA from plurality of nonvolatile memory devices 400a to 400k based on the request REQ.

The storage controller 300 may communicate the data DTA with the host 100 using the buffer device 250 as an input/output buffer. In an example embodiment, the buffer memory 250 includes a dynamic random access memory (DRAM).

The PMIC 600 may be configured to receive a plurality of power supply voltages (i.e., external supply voltages) VES1 to VESt from the host 100 through the power connector 243.

For example, the power connector 243 may include a plurality of power lines P1 to Pt, and the PMIC 600 may be configured to receive the plurality of power supply voltages VES1 to VESt from the host 100 through the plurality of power lines P1 to Pt, respectively. Here, t represents a positive integer greater than one.

The PMIC 600 may generate at least one first operating voltage VOP1 used by the storage controller 300, at least one second operating voltage VOP2 used by the plurality of nonvolatile memory devices 400a to 400k, and at least one third operating voltage VOP3 used by the buffer memory 250 based on the plurality of power supply voltages VES1 to VESt.

For example, when the PMIC 600 receives all of the plurality of power supply voltages VES1 to VESt from the host 100, the PMIC 600 may generate the at least one first operating voltage VOP1, the at least one second operating voltage VOP2, and the at least one third operating voltage VOP3 using all of the plurality of power supply voltages VES1 to VESt. On the other hand, when the PMIC 600 receives less than all of the plurality of power supply voltages VES1 to VESt from the host 100, the PMIC 600 may generate the at least one first operating voltage VOP1, the at least one second operating voltage VOP2, and the at least one third operating voltage VOP3 using all of the part of the plurality of power supply voltages VES1 to VESt that is received from the host 100.

Figure 2:
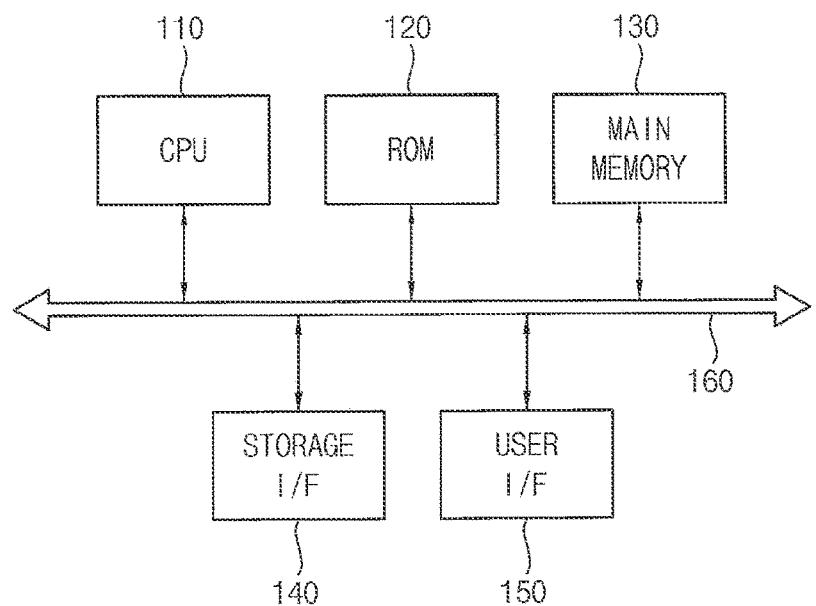
FIG. 2 is a block diagram illustrating the host in FIG. 1 according to an example embodiment.

FIG. 2 is a block diagram illustrating the host in FIG. 1 according to an example embodiment.

Referring to FIG. 2, the host 100 may include a central processing unit (CPU) 110, a read-only memory (ROM) 120, a main memory 130, a storage interface (I/F) 140 (e.g., interface circuit), a user interface (I/F) 150 and a bus 160.

The bus 160 may refer to a transmission channel via which data is transmitted between the CPU 110, the ROM 120, the main memory 130, the storage interface 140 and the user interface 150 of the host 100. The ROM 120 may store various application programs. For example, the application programs may support storage protocols such as Advanced Technology Attachment (ATA), Small Computer System Interface (SCSI), embedded Multi Media Card (eMMC), and/or Universal flash storage (UFS) protocols are stored.

The main memory 130 may temporarily store data or programs. The user interface 150 may be a physical or virtual medium for exchanging information between a user and the host 100, a computer program, etc., and may include physical hardware and logical software. For example, the user interface 150 may include an input device for allowing the user to manipulate the host 100 or provide input to the host 100, and an output device for outputting a result of processing an input of the user.

The CPU 110 may control overall operations of the host 100. The CPU 110 may generate a command and the power supply voltages VES1 to VESt for storing data in the storage device 200 or a request (or a command) and the power supply voltages VES1 to VESt for reading data from the storage device 200 by using an application stored in the ROM 120, and transmit the request and the power supply voltages VES1 to VESt to the storage device 200 via the storage interface 140.

Figure 3:
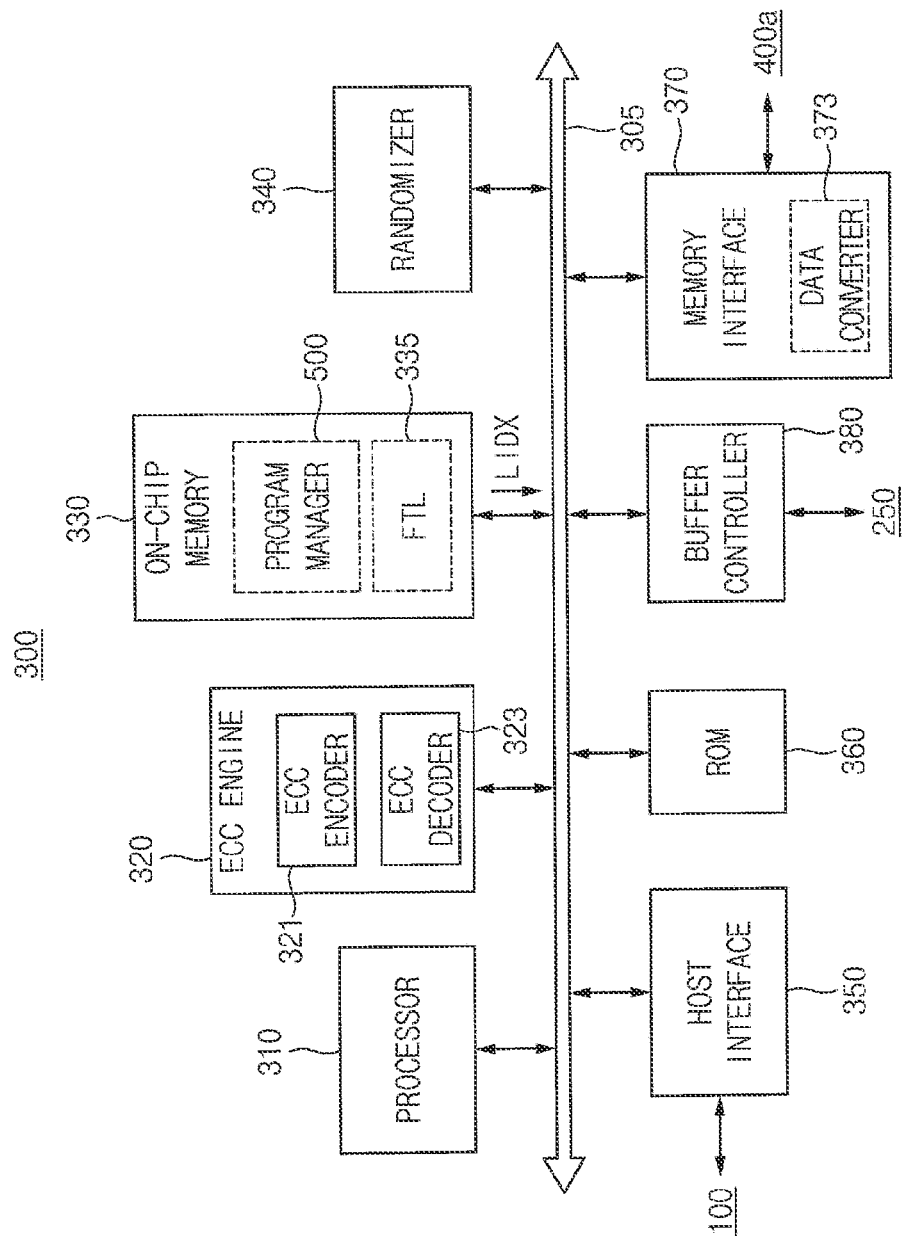
FIG. 3 is a block diagram illustrating an example of the storage controller in the storage device in FIG. 1 according to an example embodiment.

FIG. 3 is a block diagram illustrating an example of the storage controller in the storage device in FIG. 1 according to an example embodiment.

Referring to FIG. 3, the storage controller 300 may include a processor 310, an error correction code (ECC) engine 320 (e.g., a logic circuit), an on-chip memory 330, randomizer 340 (e.g., a logic circuit), a host interface 350 (e.g., an interface circuit), a ROM 360, a buffer controller 380 (e.g., a control interface), and a memory interface 370 (e.g., an interface circuit) which are connected via a bus 305.

The processor 310 controls an overall operation of the storage controller 300. The processor 310 may control the ECC engine 320, the on-chip memory 330, the randomizer 340, the host interface 350, the ROM 360, the buffer controller 380 and the memory interface 370.

The processor 310 may include one or more cores (e.g., a homogeneous multi-core or a heterogeneous multi-core). The processor 310 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 310 may execute various application programs (e.g., a flash translation layer (FTL) 335 and firmware) loaded onto the on-chip memory 330.

The on-chip memory 330 may store various application programs that are executable by the processor 310. The on-chip memory 330 may operate as a cache memory adjacent to the processor 310. The on-chip memory 330 may store a command, an address, and data to be processed by the processor 310 or may store a processing result of the processor 310. The on-chip memory 330 may be, for example, a storage medium or a working memory including a latch, a register, a static random access memory (SRAM), a dynamic random access memory (DRAM), a thyristor random access memory (TRAM), a tightly coupled memory (TCM), etc.

The processor 310 may execute the FTL 335 loaded onto the on-chip memory 330. The FTL 335 may be loaded onto the on-chip memory 330 as firmware or a program stored in the one of the nonvolatile memory devices 400a to 400k. The FTL 335 may manage mapping between a logical address provided from the host 100 and a physical address of the nonvolatile memory devices 400a to 400k and may include an address mapping table manager managing and updating an address mapping table. The FTL 335 may further perform a garbage collection operation, a wear leveling operation, and the like, as well as the address mapping described above. The FTL 335 may be executed by the processor 310 for addressing one or more of the following aspects of the nonvolatile memory devices 400a to 400k: overwrite-or in-place write-impossible, a life time of a memory cell, a limited number of program-erase (PE) cycles, and an erase speed slower than a write speed.

In an embodiment, the FTL 335 generates a location index LIDX that is used to group a plurality of memory cells included in each page of each of the nonvolatile memory devices 400a to 400k into outer cells and inner cells. In an embodiment, a distance between the outer cell and a word-line cut region is smaller than a distance between the inner cell and the word-line cut region. The outer cells may be referred to as a first group of cells and the inner cell may be referred to as a second group of cells.

The processor 310 may execute a program manager 500 loaded onto the on-chip memory 330.

The program manager 500 may group a plurality of memory cells coupled to each of a plurality of word-lines in a memory cell array of each of the nonvolatile memory devices 400a to 400k into the outer cells and the inner cells based on the location index LIDX and may control a program operation performed on target memory cells coupled to a target word-line of the plurality of word-lines such that each of the outer cells stores a first number of bits and each of the inner cells stores a second number of bits.

Here, the first number may be a natural number greater than zero and the second number may be a natural number greater than the first number.

Memory cells of the nonvolatile memory devices 400a to 400k may have a physical characteristic in which a threshold voltage distribution varies due to causes, such as a program elapsed time, a temperature, program disturbance, read disturbance and etc. For example, data stored at the nonvolatile memory devices 400a to 400k may become erroneous due to the above causes.

The storage controller 300 may utilize a variety of error correction techniques to correct such errors. For example, the storage controller 300 may include the ECC engine 320. The ECC engine 320 may correct errors which occur in the data stored in the nonvolatile memory devices 400a to 400k. The ECC engine 320 may include an ECC encoder 321 (e.g., an encoder circuit) and an ECC decoder 323 (e.g., a decoder circuit). The ECC encoder 321 may perform an ECC encoding operation on data to be stored in the nonvolatile memory devices 400a to 400k. The ECC decoder 232 may perform an ECC decoding operation on data read from the nonvolatile memory devices 400a to 400k.

The ROM 360 may store a variety of information used for operating the storage controller 300, in firmware.

The randomizer 340 may randomize data to be stored in one of the nonvolatile memory devices 400a to 400k. For example, the randomizer 340 may randomize data to be stored in one of the nonvolatile memory devices 400a to 400k by a word-line.

Data randomizing may include processing data such that program states of memory cells connected to a word-line have the same ratio. For example, if memory cells connected to one word-line are quadruple-level cells (QLC) each storing 4-bit data, each of the memory cells may have one of an erase state and first through fifteenth program states. In this case, the randomizer 340 may randomize data such that in memory cells connected to one word-line, the number of memory cells having the erase state, and each of the number of memory cells having the first through fifteenth program states may be substantially the same as one another. For example, memory cells in which randomized data is stored have program states of which the number is equal to one another.

The randomizer 340 may randomize page data. An example of an operation of the randomizer 340 is described below. However, the embodiments are not limited thereto. For example, the randomizer 340 may randomize data such that in memory cells connected to one word-line, the number of memory cells having the erase state and each of the number of memory cells having the first through fifteenth program states are approximately the same value. For example, memory cells in which randomized data is stored have program states of which the number may be similar to one another.

In embodiments, when the number of memory cells having the erase state and each of the number of memory cells having the first through fifteenth program states are approximately the same value, this may mean that the number of the number of memory cells having the erase state and each of the number of memory cells having the first through fifteenth program states are within a particular threshold number of each other.

The buffer controller 380 may control an operation of the buffer memory 250.

The storage controller 300 may communicate with the host 100 through the host interface 350. For example, the host interface 350 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc.

The storage controller 300 may communicate with the nonvolatile memory devices 400a to 400k through the memory interface 370. The storage controller 370 may include a data converter 373.

Figure 4:
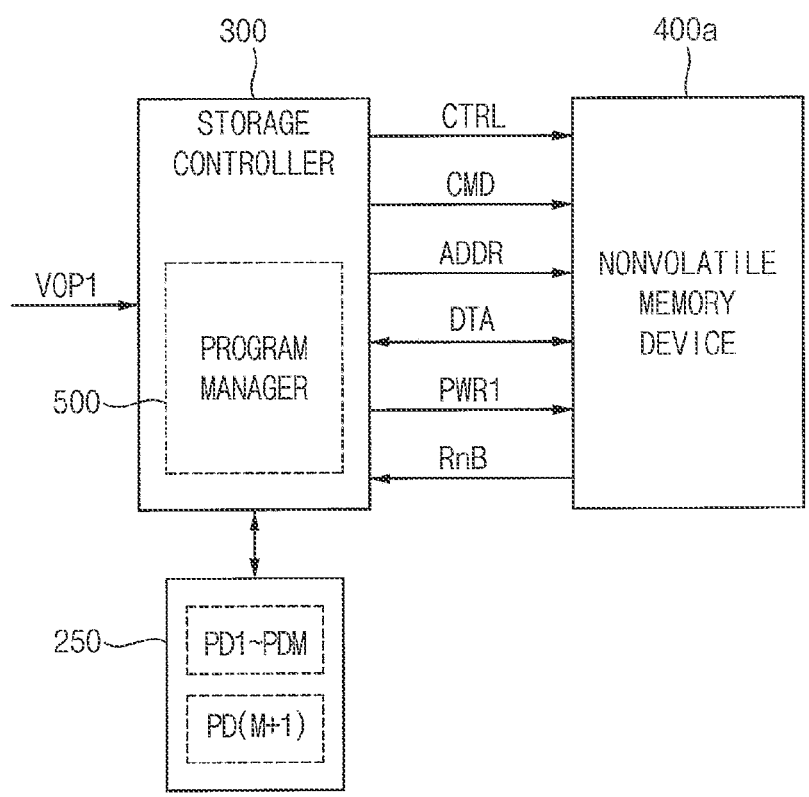
FIG. 4 is a block diagram illustrating a connection relationship between the storage controller and one nonvolatile memory device in the storage device of FIG. 1.

FIG. 4 is a block diagram illustrating a connection relationship between the storage controller and one nonvolatile memory device in the storage device of FIG. 1.

In FIG. 4 the buffer memory 250 connected to the storage controller 300 is also illustrated.

Referring to FIG. 4, the nonvolatile memory device 400a may operate based on the first operating voltage VOP1.

The nonvolatile memory device 400a may perform an erase operation, a program operation, and/or a write operation under control of the storage controller 300. The nonvolatile memory device 400a may receive a command CMD and an address ADDR through input/output lines from the storage controller 300 and may receive a data DTA through the buffer memory 250 for performing such operations. In addition, the nonvolatile memory device 400a may receive a control signal CTRL through a control line and receives power PWR1 through a power line from the storage controller 300. In addition, the nonvolatile memory device 400a may provide the storage controller 300 with the data DTA using the buffer memory 250.

The data DTA may include first through M-th page data PD1 to PDM and a (M+1)-th page data PD(M+1). Here, M is a natural number greater than two. For example, the first through M-th page data PD1 to PDM may be data for several pages and the (M+1)-th page data PD(M+1) may be data for a single page different from the several pages.

The storage controller 300 may include the program manager 500. The program manager 500 may assign the program operation to be performed on the target memory cells associated with the data DTA to one of a first program operation and a second program operation and may assign the data DTA to one of the first through M-th page data PD1 to PDM and the (M+1)-th page data PD(M+1).

The buffer memory 250 may temporarily store the first through M-th page data PD1 to PDM from the host 100, may provide the first through M-th page data PD1 to PDM to the storage controller 300, may be released after the first program operation has completed, may temporarily store the (M+1)-th page data PD(M+1) from the host 100 and may provide the (M+1)-th page data PD(M+1) to the storage controller 300.

Figure 5:
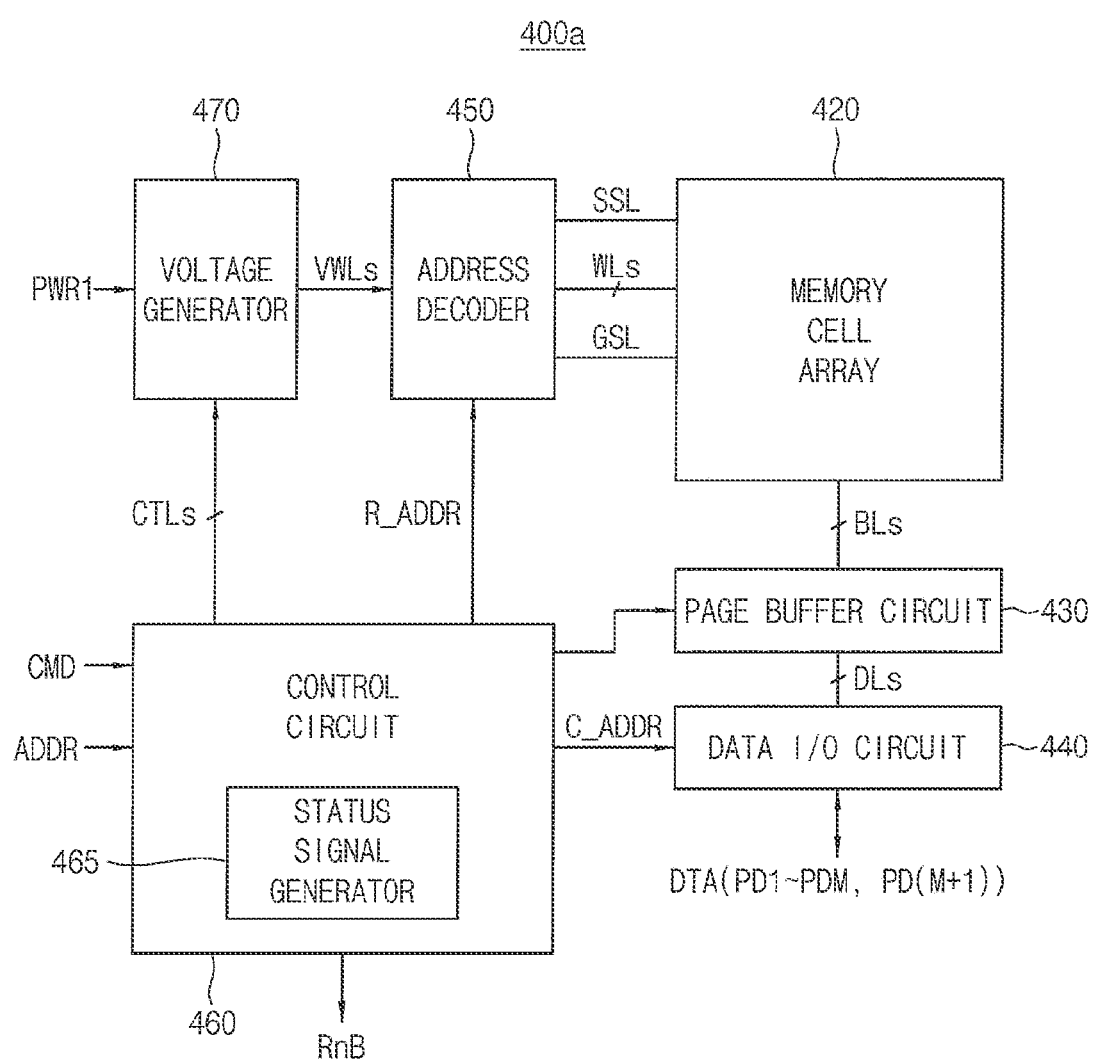
FIG. 5 is a block diagram illustrating the nonvolatile memory device in FIG. 4 according to an example embodiment.

FIG. 5 is a block diagram illustrating the nonvolatile memory device in FIG. 4 according to an example embodiment.

Referring to FIG. 5, the nonvolatile memory device 400a may include a memory cell array 420, an address decoder 450, a page buffer circuit 430, a data input/output (I/O) circuit 440, a control circuit 460, and a voltage generator 470.

The memory cell array 420 may be coupled to the address decoder 450 through a string selection line SSL, a plurality of word-lines WLs, and a ground selection line GSL. In addition, the memory cell array 420 may be coupled to the page buffer circuit 430 through a plurality of bit-lines BLs.

The memory cell array 420 may include a plurality of memory cells coupled to the plurality of word-lines WLs and the plurality of bit-lines BLs.

In an example embodiment, the memory cell array 420 may be or include a three-dimensional memory cell array, which is formed on a substrate in a three-dimensional structure (e.g., a vertical structure). In this case, the memory cell array 420 may include vertical cell strings that are vertically oriented such that at least one memory cell is located over another memory cell.

Figure 6:
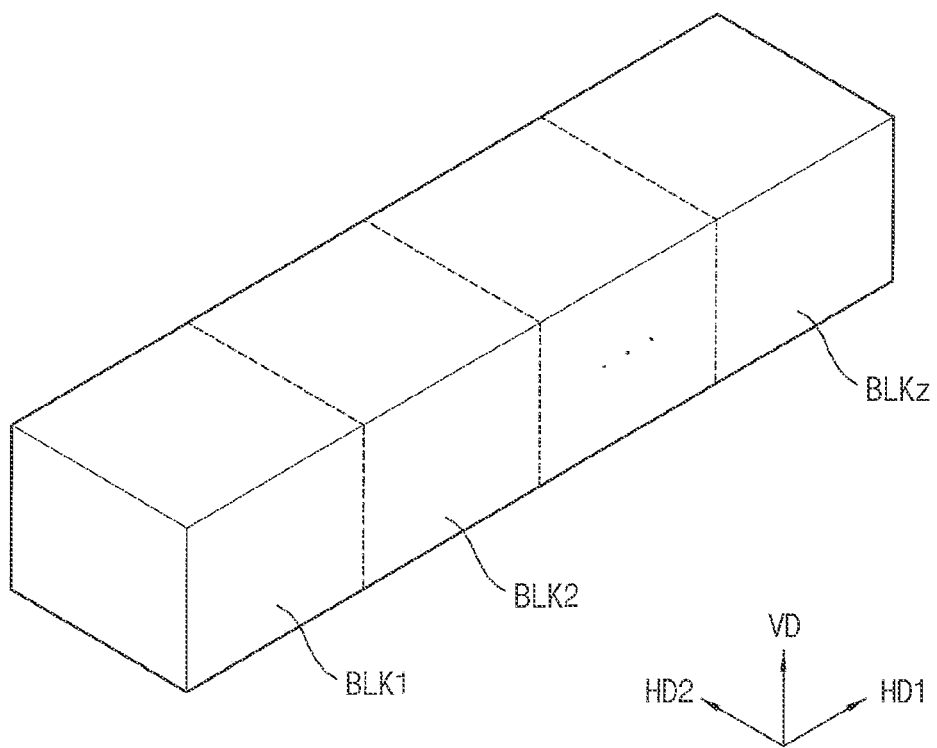
FIG. 6 is a block diagram illustrating the memory cell array in the nonvolatile memory device of FIG. 5.

FIG. 6 is a block diagram illustrating the memory cell array in the nonvolatile memory device of FIG. 5.

Referring to FIG. 6, the memory cell array 420 may include a plurality of memory blocks BLK1 to BLKz. Here, z is a natural number greater than two. The memory blocks BLK1 to BLKz extend along a first horizontal direction HD1, which may be for example an X-axis direction, a second horizontal direction HD2, which may be for example a Y-axis direction, and a vertical direction VD, which may be for example a Z-axis direction. In an example embodiment, the memory blocks BLK1 to BLKz are selected by the address decoder 450 in FIG. 5. For example, the address decoder 450 may select a memory block BLK corresponding to a block address among the memory blocks BLK1 to BLKz.

Figure 7:
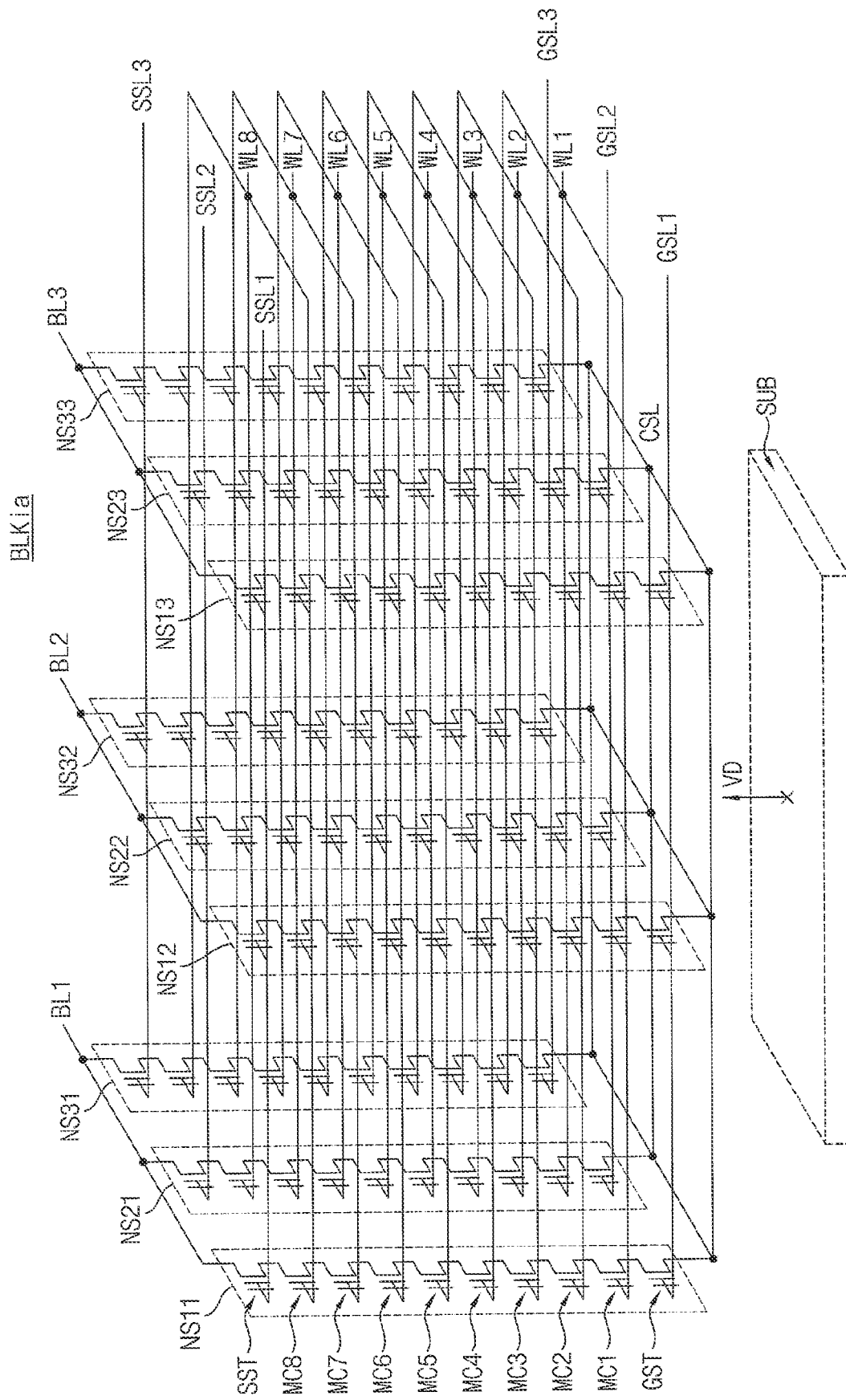
FIG. 7 is a circuit diagram illustrating one of the memory blocks of FIG. 6.

FIG. 7 is a circuit diagram illustrating one of the memory blocks of FIG. 6.

The memory block BLKia of FIG. 7 may be formed on a substrate SUB in a three-dimensional structure (or a vertical structure). For example, a plurality of memory cell strings included in the memory block BLKia may be formed in the vertical direction VD perpendicular to the substrate SUB.

Referring to FIG. 7, the memory block BLKia may include memory cell strings NS11 to NS33 (e.g., NS11, NS12, NS13, NS21, NS22, NS23, NS31, NS32, and NS33) coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 7, each of the memory cell strings NS11 to NS33 is illustrated to include eight memory cells MC1 to MC8. However, embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., word-line WL1) having the same height may be commonly connected, and the ground selection lines GSL1 to GSL3 and the string selection lines SSL1 to SSL3 may be separated. In FIG. 5, the memory block BLKi is illustrated to be coupled to eight word-lines WL1 to WL8 and three bit-lines BL1 to BL3. However, embodiments are not limited thereto. In some example embodiments, the memory cell array 420 may be coupled to any number of word-lines and bit-lines.

Figure 8:
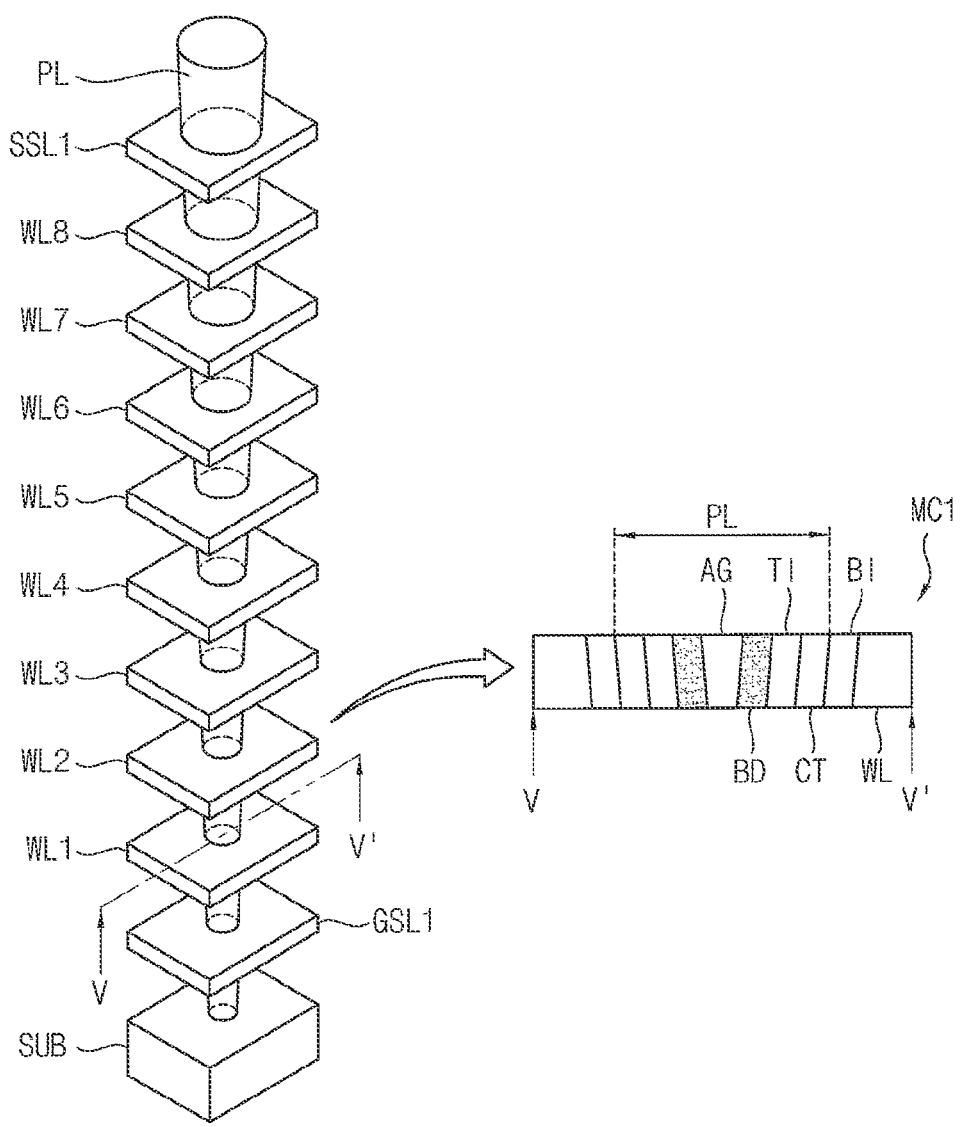
FIG. 8 illustrates an example of a structure of a cell string CS in the memory block of FIG. 7.

FIG. 8 illustrates an example of a structure of a NAND cell string CS in the memory block of FIG. 7.

Referring to FIGS. 7 and 8, a pillar PL is provided on the substrate SUB such that the pillar PL extends in a direction perpendicular to the substrate SUB, for example a vertical direction VD, to make contact with the substrate SUB. Each of the ground selection line GSL, the word lines WL1 to WL8, and the string selection lines SSL illustrated in FIG. 8 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line V-V' is also illustrated in FIG. 8. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Figure 9:
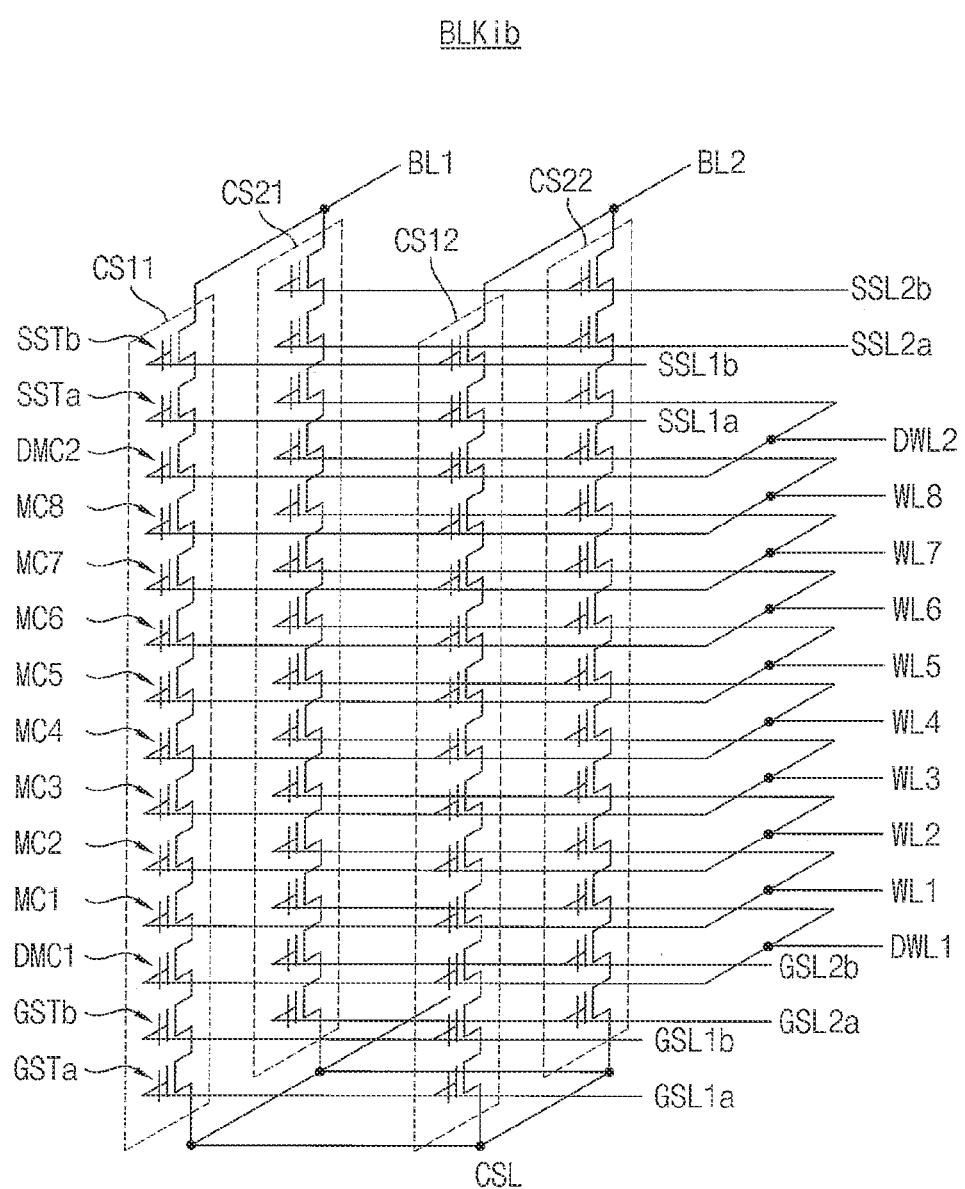
FIG. 9 is a circuit diagram illustrating one of the memory blocks of FIG. 6.

FIG. 9 is a circuit diagram illustrating one of the memory blocks of FIG. 6.

Referring to FIG. 9, a memory block BLKib may include a plurality of cell strings CS11, CS12, CS21, and CS22. The plurality of cell strings CS11, CS12, CS21, and CS22 may be arranged in a first horizontal direction (i.e., a row direction) and a second horizontal direction (i.e., a column direction). Each of the plurality of cell strings CS11, CS12, CS21, and CS22 may be referred to as a NAND cell string.

Cell strings positioned at the same column from among the plurality of cell strings CS11, CS12, CS21, and CS22 may be connected with the same bit-line. For example, the cell strings CS11 and CS21 may be connected with a first bit-line BL1, and the cell strings CS12 and CS22 may be connected with a second bit-line BL2. Each of the plurality of cell strings CS11, CS12, CS21, and CS22 may include a plurality of cell transistors. Each of the plurality of cell transistors may include a charge trap flash (CTF) memory cell. The plurality of cell transistors may be stacked in a height direction that is perpendicular to a plane (e.g., a semiconductor substrate (not illustrated)) defined by the row direction and the column direction.

The plurality of cell transistors may be connected in series between a relevant bit-line (e.g., BL1 or BL2) and a common source line CSL. For example, the plurality of cell transistors may include string selection transistors SSTa and SSTb, dummy memory cells DMC1 and DMC2, memory cells MC1 to MC8, and ground selection transistors GSTa and GSTb. The serially-connected string selection transistors SSTa and SSTb may be provided between the serially-connected memory cells MC1 to MC8 and the relevant bit-line (e.g., BL1 and BL2). The serially-connected ground selection transistors GSTa and GSTb may be provided between the serially-connected memory cells MC1 to MC8 and the common source line CSL. In an embodiment, the second dummy memory cell DMC2 may be provided between the serially-connected string selection transistors SSTa and SSTb and the serially-connected memory cells MC1 to MC8, and the first dummy memory cell DMC1 may be provided between the serially-connected memory cells MC1 to MC8 and the serially-connected ground selection transistors GSTa and GSTb.

In the plurality of cell strings CS11, CS12, CS21, and CS22, memory cells positioned at the same height from among the memory cells MC1 to MC8 may share the same word-line. For example, the first memory cells MC1 of the plurality of cell strings CS11, CS12, CS21, and CS22 may be positioned at the same height from the substrate (not illustrated) and may share a first word-line WL1. The second memory cells MC2 of the plurality of cell strings CS11, CS12, CS21, and CS22 may be positioned at the same height from the substrate (not illustrated) and may share a second word-line WL2.

In the plurality of cell strings CS11, CS12, CS21, and CS22, the dummy memory cells DMC1 or DMC2 positioned at the same height may share the same dummy word-line. For example, the first dummy memory cells DMC1 of the plurality of cell strings CS11, CS12, CS21, and CS22 may share a first dummy word-line DWL1, and the second dummy memory cells DMC2 of the plurality of cell strings CS11, CS12, CS21, and CS22 may share a second dummy word-line DWL2.

In the plurality of cell strings CS11, CS12, CS21, and CS22, string selection transistors positioned at the same height and the same row from among the string selection transistors SSTa and SSTb may be connected with the same string selection line. For example, the string selection transistors SSTb of the cell strings CS11 and CS12 may be connected with a string selection line SSL1b, and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a. Although not illustrated, string selection transistors positioned at the same row from among the string selection transistors SSTa and SSTb of the plurality of cell strings CS11, CS12, CS21, and CS22 may share the same string selection line. For example, the string selection transistors SSTa and SSTb of the cell strings CS11 and CS12 may share a first string selection line, and the string selection transistors SSTa and SSTb of the cell strings CS21 and CS22 may share a second string selection line different from the first string selection line.

Ground selection transistors positioned at the same height and the same row from among the ground selection transistors GSTa and GSTb of the plurality of cell strings CS11, CS12, CS21, and CS22 may be connected with the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a. Although not illustrated in the drawings, the ground selection transistors GSTa and GSTb of the plurality of cell strings CS11, CS12, CS21, and CS22 may share the same ground selection line. Alternatively, in the plurality of cell strings CS11, CS12, CS21, and CS22, ground selection transistors positioned at the same height from among the ground selection transistors GSTa and GSTb may share the same ground selection line. Alternatively, ground selection transistors positioned at the same row from among the ground selection transistors GSTa and GSTb of the plurality of cell strings CS11, CS12, CS21, and CS22 may share the same ground selection line.

Referring back to FIG. 5, the control circuit 460 may receive a command signal including the command CMD and an address signal including the address ADDR from the storage controller 300, and may control an erase loop, a program loop and/or a read operation of the nonvolatile memory device 400a based on the command CMD and the address ADDR. The program loop may include a program operation and a program verification operation. The erase loop may include an erase operation and an erase verification operation.

For example, the control circuit 460 may generate control signals CTLs, which are used for controlling the voltage generator 470, based on at least one of the command signal and the command CMD, and generate a row address R_ADDR and a column address C_ADDR based on at least one of the address signal and the address signal ADDR. The control circuit 460 may provide the row address R_ADDR to the address decoder 450 and may provide the column address C_ADDR to the data I/O circuit 440.

The address decoder 450 may be coupled to the memory cell array 420 through the string selection line SSL, the plurality of word-lines WLs, and the ground selection line GSL. During the program operation or the read operation, the address decoder 450 may determine one of the plurality of word-lines WLs as a first word-line (e.g., a selected word-line) and determine the rest of the plurality of word-lines WLs except for the first word-line as unselected word-lines based on the row address R_ADDR.

The voltage generator 470 may generate word-line voltages VWLs, which are used for the operation of the nonvolatile memory device 400a, based on the control signals CTLs. The voltage generator 470 may receive the power PWR1 from the storage controller 300. The word-line voltages VWLs may be applied to the plurality of word-lines WLs through the address decoder 450.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the first word-line and may apply a program pass voltage to the unselected word-lines. In addition, during the program verification operation, the voltage generator 470 may apply a program verification voltage to the first word-line and may apply a verification pass voltage to the unselected word-lines.

Furthermore, during the read operation, the voltage generator 470 may apply a read voltage to the first word-line and may apply a read pass voltage to the unselected word-lines. The page buffer circuit 430 may be coupled to the memory cell array 420 through the plurality of bit-lines BLs. The page buffer circuit 430 may include a plurality of page buffers. In an example embodiment, one page buffer of the page buffers is connected to one bit-line. In an example embodiment, one page buffer of the page buffers is connected to two or more bit-lines.

The page buffer circuit 430 may temporarily store data to be programmed in a selected page or data read out from the selected page.

The data I/O circuit 440 may be coupled to the page buffer circuit 430 through data lines DLs. During the program operation, the data I/O circuit 440 may receive the first through M-th page data PD1 to PDM and the (M+1)-th page data PD(M+1) from the storage controller 300, and provide the first through M-th page data PD1 to PDM and the (M+1)-th page data PD(M+1) to the page buffer circuit 430 based on the column address C_ADDR received from the control circuit 460.

During the read operation, the data I/O circuit 440 may provide the first through M-th page data PD1 to PDM and the (M+1)-th page data PD(M+1), which are stored in the page buffer circuit 430, to the storage controller 300 based on the column address C_ADDR received from the control circuit 460.

The control circuit 460 may control the page buffer circuit 430 and data I/O circuit 440.

The control circuit 460 may include a status signal generator 465 and the status signal generator 465 may generate a status signal RnB indicating whether each of the program operation, the erase operation and the read operation has completed and/or is in progress.

The storage controller 300 may determine an idle state or a busy state of each of the nonvolatile memory devices 400a to 400k based on the status signal RnB. For example, if the status signal RnB indicates that none of the program operation, the erase operation and the read operation are in progress for the nonvolatile memory devices 400a, the storage controller 300 may determine that the nonvolatile memory device 400a is in an idle state. For example, if the status signal RnB indicates that one of the program operation, the erase operation and the read operation is in progress for the nonvolatile memory device 400a, the storage controller 300 may determine that the nonvolatile memory devices 400a is in a busy state.

Figure 10:
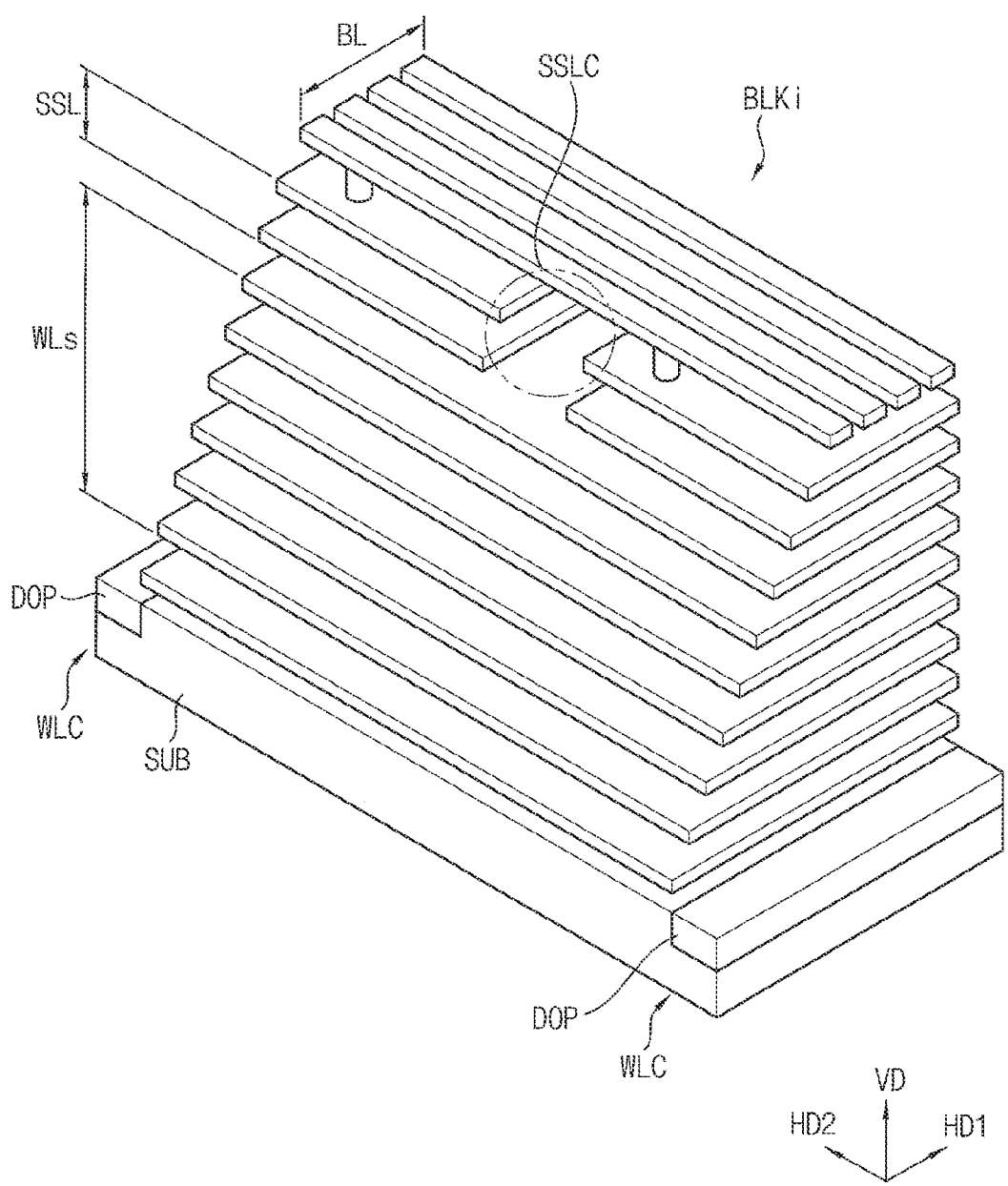
FIG. 10 is a perspective view illustrating one of the memory blocks in FIG. 6.

FIG. 10 is a perspective view illustrating one of the memory blocks in FIG. 6.

Referring to FIG. 10, the memory block BLKi may be implemented such that at least one ground selection line GSL, a plurality of word-lines WLs and at least one string selection line SSL are stacked on a substrate between word-line cut regions WLC. Doping regions DOP may be formed in top portions of the substrate of the word-line cut regions WLC. The doping region may be used as common source lines CSL or common source nodes CSN to which a common source voltage is applied. The at least one string selection line SSL may be divided by a string selection line cut region SSLC extending in the first horizontal direction HD1.

A plurality of vertical channels or channel holes penetrate the at least one ground selection lines GSL, the plurality of word-lines WLs and the at least one string selection lines SSL. The at least one ground selection lines GSL, the plurality of word-lines WL and the at least one string selection lines SSL may be formed in the shape of planks, rectangular prisms, rectangular cuboids, etc. Bit-lines BL are connected to top surfaces of the channel holes.

Figure 11A:
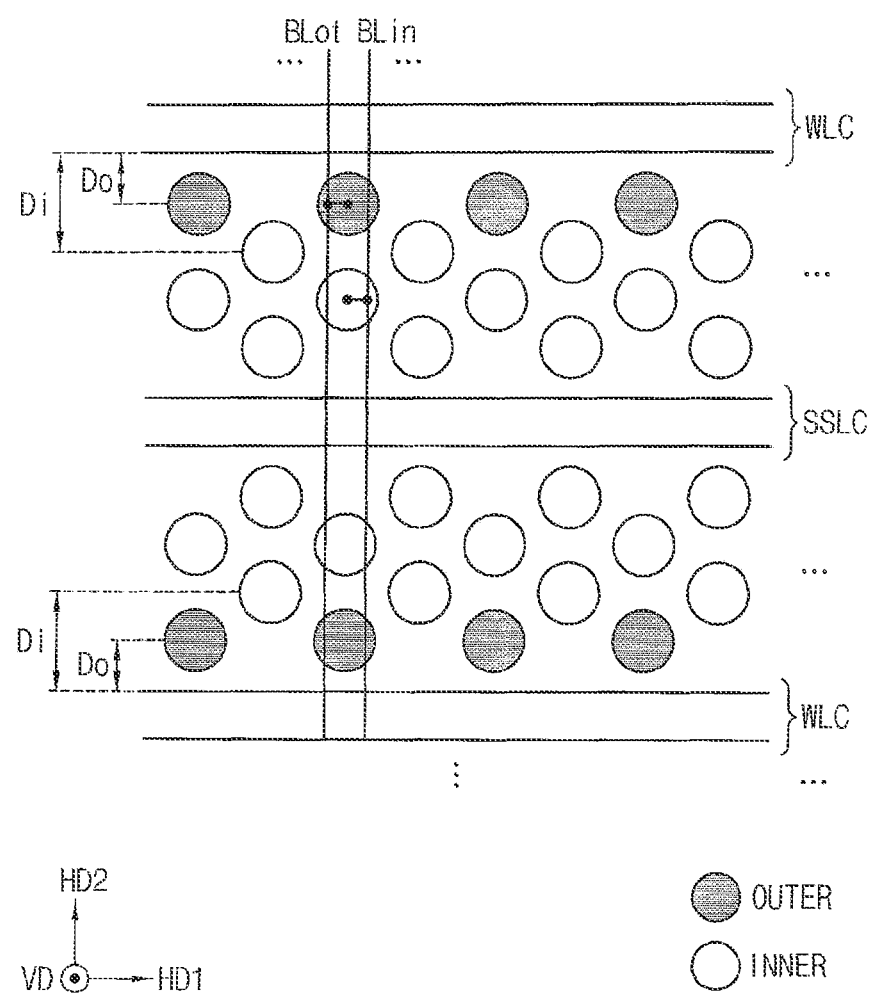
FIGS. 11A through 11C are top views of examples of the memory block of FIG. 10, respectively.
Figure 11B:
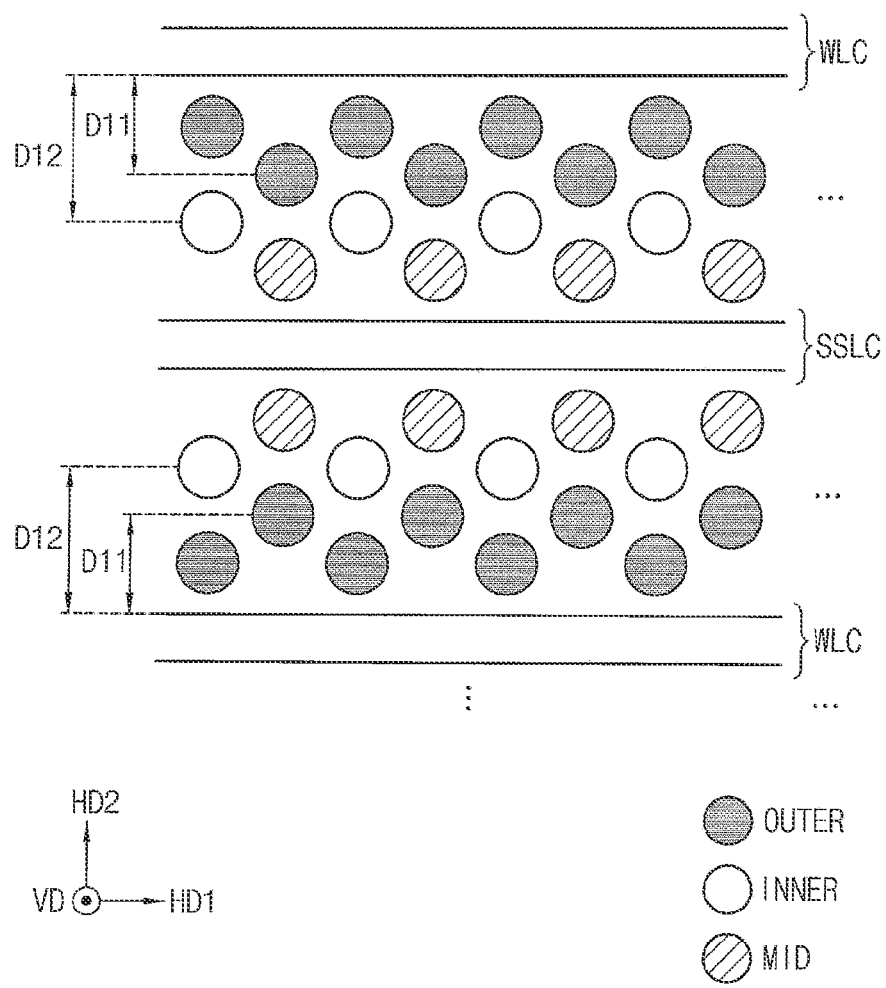
Figure 11C:
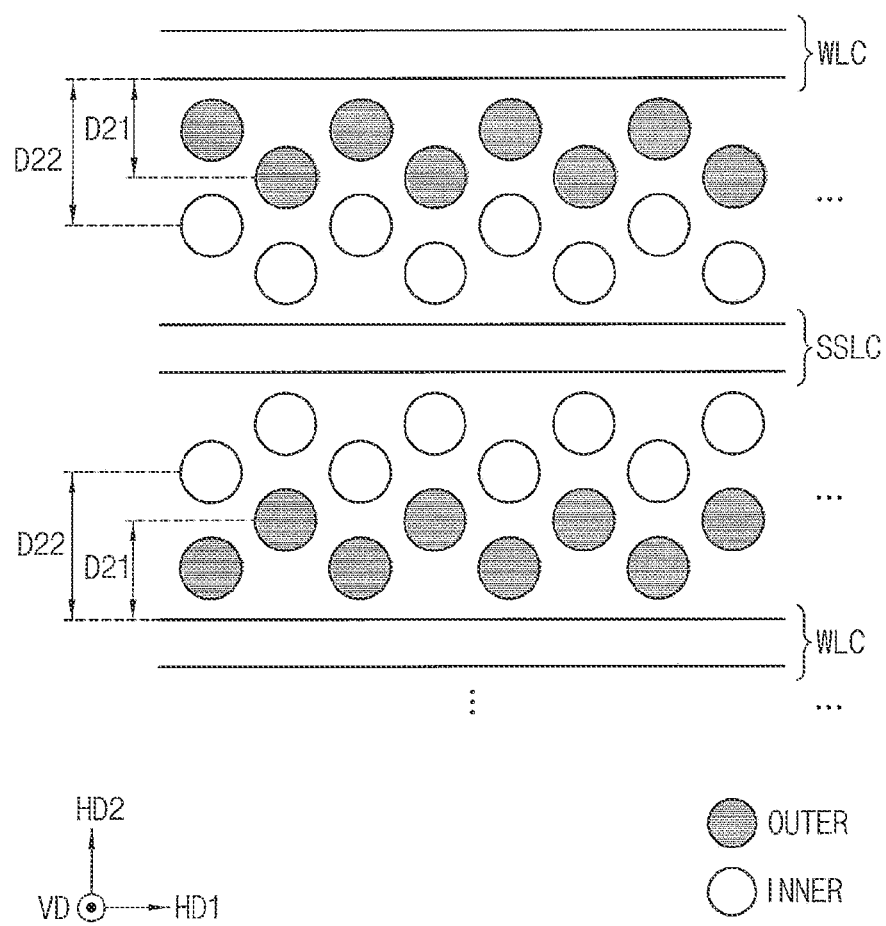
Figure 12:
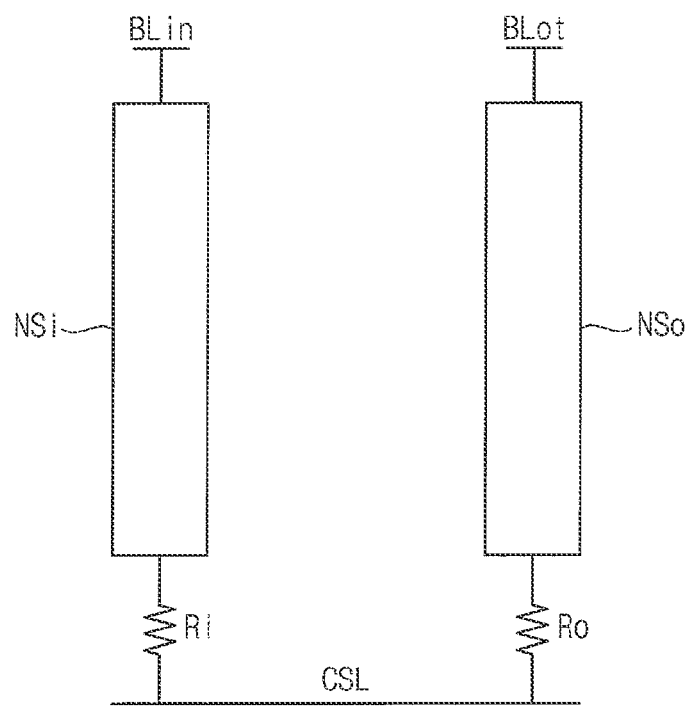
FIG. 12 is a circuit diagram illustrating a connection relationship of NAND strings in the memory block in FIG. 11A.

FIGS. 11A through 11C are top views of examples of the memory block of FIG. 10, respectively and FIG. 12 is a circuit diagram illustrating connection relationship of NAND strings in the memory block in FIG. 11A.

In FIG. 11A, white circles represent inner cells or inner channel holes and shaded circles represent outer cells or outer channel holes. The common source lines corresponding to the doping region DOP in FIG. 9 are disposed in the word-line cut regions WLC.

Referring to FIG. 11A, the channel holes may be formed in a zig-zag arrangement in the memory block BLKi. Through the zig-zag arrangement, the area of the memory block BLKi may be reduced. Outer channel holes and inner channel holes are disposed in the second horizontal direction HD2 between two adjacent word-line cut regions WLC in the memory block BLKi. One of the inner channel holes and the outer channel holes may be connected to an even-numbered bit-line and the other may be connected to an odd-numbered bit-line. For convenience of illustration, only one bit-line pair BLot and BLin are illustrated and the other bit-lines are omitted in FIG. 11A.

As illustrated in FIG. 11A, the outer cells may be formed in the outer channel holes and the inner cells may be formed on the inner channel holes where a distance Do between the outer channel hole and the word-line cut region WLC is smaller than a distance Di between the inner channel hole and the word-line cut region WLC.

Referring to FIG. 12, an inner NAND string NSi is formed in the inner channel hole and an outer NAND string NSo is formed in the outer channel hole. One end of the inner NAND string NSi is connected to the inner bit-line BLi and the other end of the inner NAND string NSi is connected to the common source line CSL through an inner resistor Ri. One end of the outer NAND string NSo is connected to the outer bit-line BLo and the other end of the outer NAND string NSo is connected to the common source line CSL through an outer resistor Ro.

Because the distance Do between the outer channel hole and the word-line cut region WLC is smaller than a distance Di between the inner channel hole and the word-line cut region WLC as illustrated in FIG. 11A, the resistance value of the inner resistor Ri is greater than the resistance value of the outer resistor Ro.

As such, in an embodiment, the inner NAND string NSi and the outer NAND string NSo are connected to the common source line CSL through the resistors Ri and Ro of different resistance values. The inner cells in the inner NAND string NSi and the outer cells in the outer NAND string NSo may have different electrical characteristics due to the asymmetric connection structure of the inner NAND string NSi and the outer NAND string NSo. Such different electrical characteristics may result in a difference in error bit levels. That is, a probability of error occurrence in the outer cells which are closer to the word-line cut region WLC than the inner cells is greater than a probability of error occurrence in the inner cells.

Referring to FIG. 11B, the storage controller 300 of FIG. 3 may group a plurality of memory cells in a memory block into outer cells disposed within a first distance D11 from the word-line cut region WLC, inner cells disposed outside the first distance D11 and within a second distance D12 and mid cells disposed between the inner cells based on a distance from the word-line cut region WLC. The mid cells may be referred to as a third group of cells.

Referring to FIG. 11C, the storage controller 300 of FIG. 3 may group a plurality of memory cells in a memory block into outer cells disposed within a first distance D21 from the word-line cut region WLC and inner cells disposed outside of the first distance D21 and within a second distance D22 based on a distance from the word-line cut region WLC. The storage controller 300 may further group each of the outer cells and the inner cells into at least two groups based on the distance from the word-line cut region WLC.

Figure 13A:
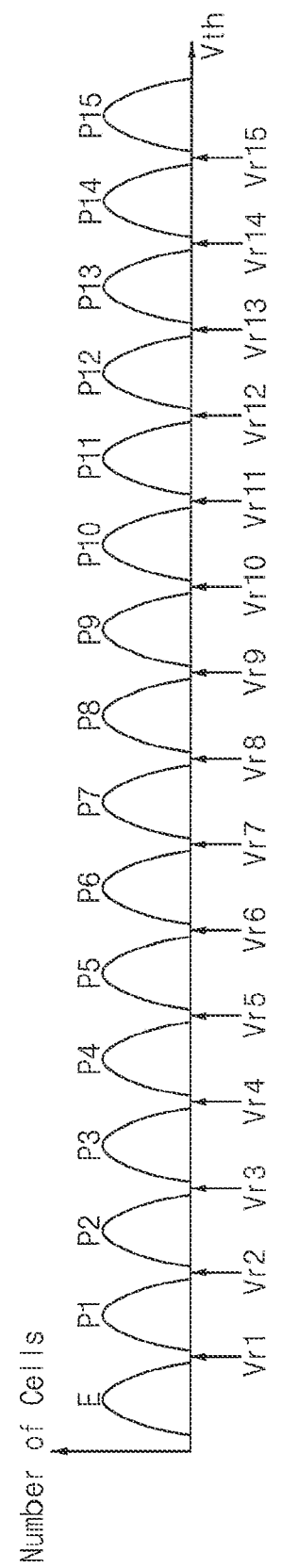
FIG. 13A is a graph showing a threshold voltage distribution of memory cells when a memory cell included in the memory cell array in FIG. 5 is a 4-bit quadruple level cell (QLC).

FIG. 13A is a graph showing a threshold voltage distribution of memory cells when a memory cell included in the memory cell array in FIG. 5 is a 4-bit quadruple level cell (QLC).

Referring to FIG. 13A, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, because an interval between threshold voltages distributions is small, a small change in the threshold voltage Vth may cause a large problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, embodiments are not limited thereto. For example, in embodiments, assuming that the first read voltage Vr1 is applied, when a memory cell is turned on, data '0' may be stored, and when the memory cell is turned off, data '1' may be stored. As such, a logic level of data may vary according to the present disclosure.

Figure 13B:
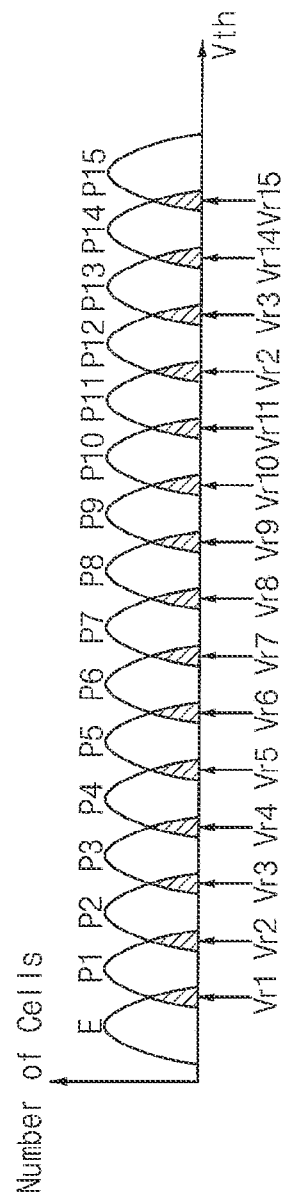
FIG. 13B and FIG. 13C are graphs showing examples in which a threshold voltage of memory cells in the graph of FIG. 13A is changed, respectively.
Figure 13C:
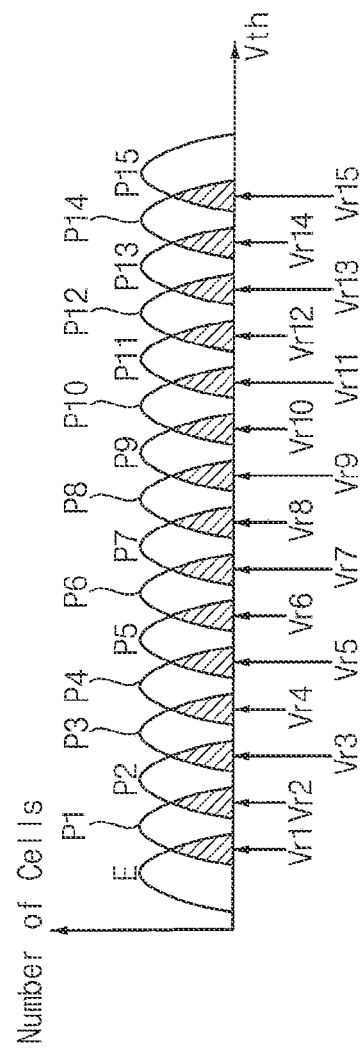

FIG. 13B and FIG. 13C are graphs showing examples in which a threshold voltage of memory cells in the graph of FIG. 13A is changed, respectively.

FIG. 13B shows that a threshold voltage of inner cells is changed and FIG. 13C shows that a threshold voltage of outer cells is changed.

Referring to FIGS. 13B and 13C, memory cells respectively programmed to the erase state E and the first through fifteenth program states P1 through P15 may have a changed distribution as shown in FIGS. 13B and 13C according to a read environment. In FIGS. 13B and 13C, memory cells belonging to hatched portions may have read errors, thereby reducing the reliability of a nonvolatile memory device. A number of read errors in FIG. 13C may be greater than a number of read errors in FIG. 13B.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the nonvolatile memory device.

When data is read from the nonvolatile memory device 400a, a raw bit error rate (RBER) may vary according to a voltage level of a read voltage. An optimum or, alternatively, desirable voltage level of a read voltage maybe determined according to a distribution pattern of the memory cells. Accordingly, as a distribution of the memory cells changes, an optimum or, alternatively, desirable voltage level of a read voltage needed to read data from the nonvolatile memory device may change.

FIG. 13D illustrates a table for explaining bit mapping for programming memory cells according to an example embodiment.

For convenience of explanation, the present embodiment relates a QLC memory cell. However, in other embodiments the memory cell may be a different type other than a QLC type.

Referring to FIG. 13D, when memory cells are QLCs, each of the memory cells may store a least significant bit (LSB), an extra significant bit (ESB), an upper significant bit (USB), and a most significant bit (MSB). Further referring to FIG. 8, LSBs stored in memory cells in a first row from among the memory cells connected to the word-line WL1 may form a first page, and MSBs stored therein may form a fourth page. USBs stored in the memory cells in the first row from among the memory cells connected to the word-line WL1 may form a third page, and ESB stored therein may form a second page.

Figure 14:
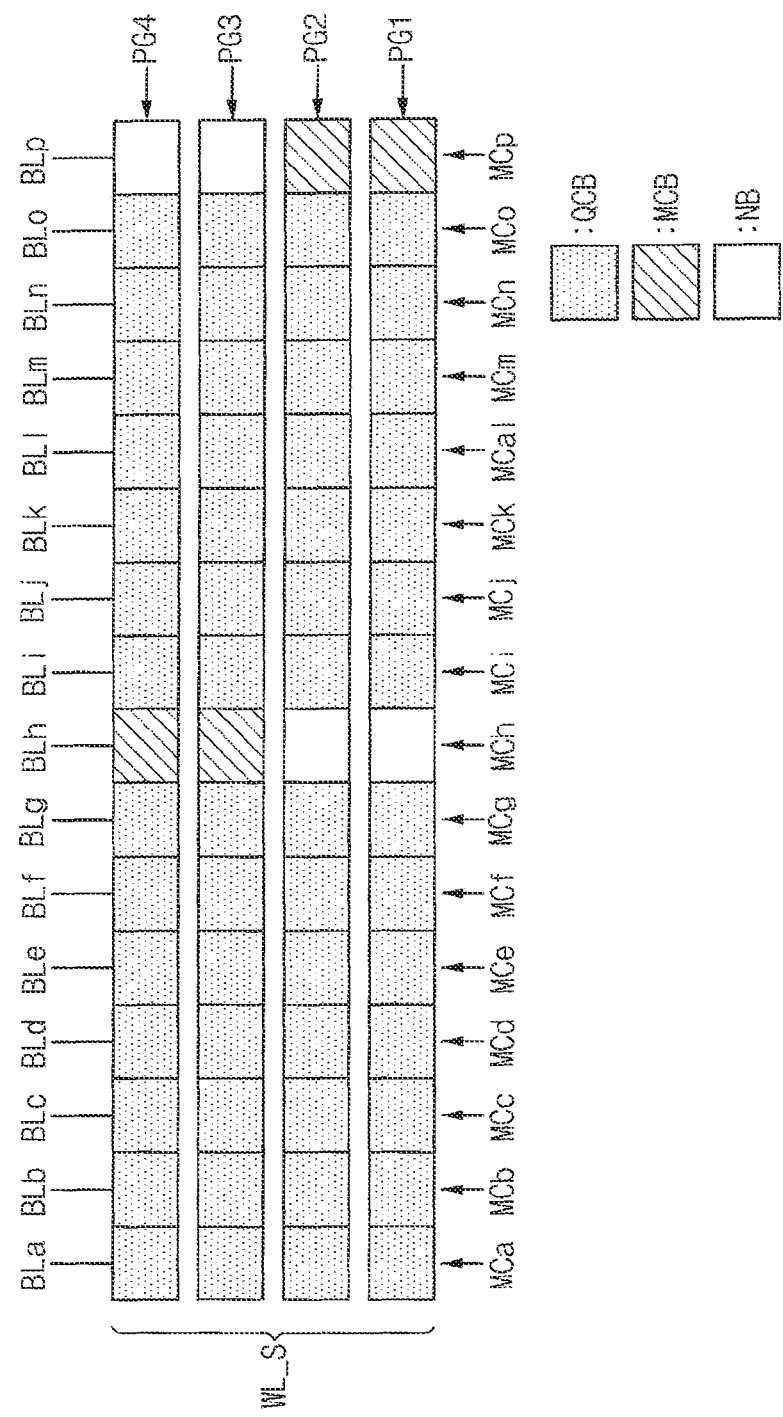
FIG. 14 illustrates an example of a page of a target word-line according to an example embodiment.

FIG. 14 illustrates an example of a page of a target word-line according to an example embodiment.

Referring to FIG. 14, a target word-line WL_S may include first, second, third and fourth pages PG1, PG2, PG3 and PG4, and the target word-line WL_S is coupled to memory cells MCa, MCb, MCc, MCd, MCe, MCf, MCg, MCh, MCi, MCj, MCK, MCl, MCm, MCn, MCo and MCp coupled to bit-lines BLa, BLb, BLc, BLd, BLe, BLf, BLg, BLh, BLi, BLj, BLk, BL1, BLm, BLn, BLo and BLp, respectively.

Each of the memory cells MCa, MCb, MCc, MCd, MCe, MCf, MCg, MCi, MCj, MCk, MCl, MCm, MCn and MCo is programmed to store 4-bits (i.e., quadruple cell bit (QCB)) and cach of the memory cells MCh and MCp is programmed to store 2-bits (i.e., multi-cell bit (MCB)). Therefore, each of the first through fourth pages PG1, PG2, PG3 and PG4 may store a null bit NB (or null bits) and at least two of the first through fourth pages PG1, PG2, PG3 and PG4 may store a different number of bits. In an embodiment, the null bit NB (or null bits) does not store any information can be removed from a page after it is processed. The memory cells MCa, MCb, MCc, MCd, MCe, MCf, MCg, MCi, MCj. MCk, MCl, MCm, MCn and MCo may correspond to the inner cells and the memory cells MCh and MCp may correspond to the outer cells.

Figure 15:
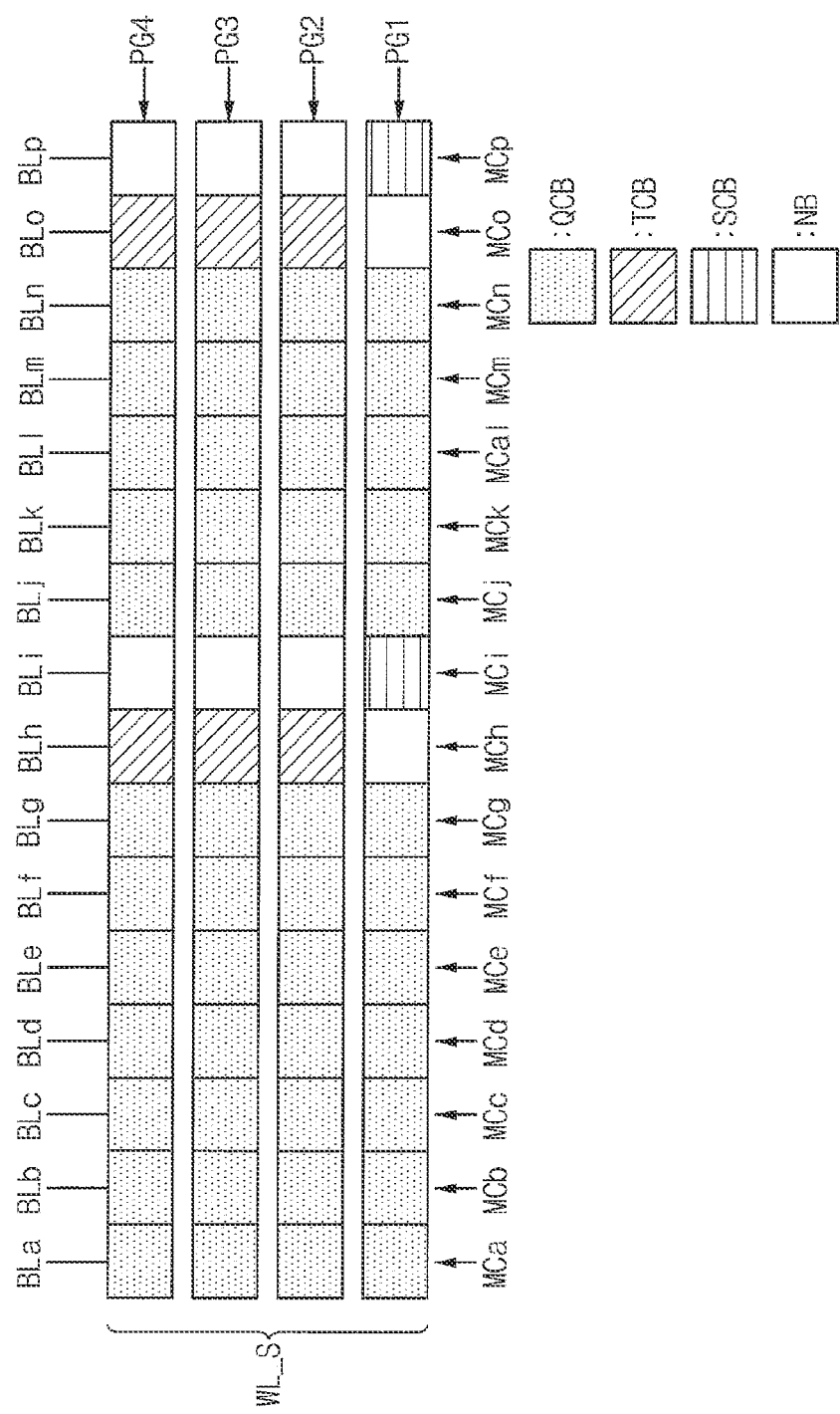
FIG. 15 illustrates an example of a page of a target word-line according to an example embodiment.

FIG. 15 illustrates an example of a page of a target word-line according to an example embodiments.

Referring to FIG. 15, a target word-line WL_S may include first, second, third and fourth pages PG1, PG2, PG3 and PG4, and the target word-line WL_S is coupled to memory cells MCa, MCb, MCc, MCd, MCe, MCf, MCg, MCh, MCi, MCj, MCK, MCl, MCm, MCn, MCo and MCp coupled to bit-lines BLa, BLb, BLc, BLd, BLe, BLf, BLg, BLh, BLi, BLj, BLk, BL1, BLm, BLn, BLo and BLp, respectively.

Each of the memory cells MCa, MCb, MCc, MCd, MCe, MCf, MCg, MCk, MCl, MCm and MCn is programmed to store 4-bits (i.e., QLC), each of the memory cells MCh and MCo is programmed to store 3-bits (i.e., triple cell bit (TCB)) and each of the memory cells MCi and MCp is programmed to store 1-bit (i.e., single cell bit (SCB)). Therefore, each of the first through fourth pages PG1, PG2, PG3 and PG4 may store a null bit NB and at least two of the first through fourth pages PG1, PG2, PG3 and PG4 may store a different number of bits with respect to each other. The memory cells MCa, MCb, MCc, MCd, MCe, MCf, MCg, MCh, MCi, MCj, MCK, MCl, MCm, MCn, MCo and MCp may correspond to the inner cells, the memory cells MCh and MCo may correspond to the mid cells and the MCi and MCp may correspond to the outer cells.

Figure 16:
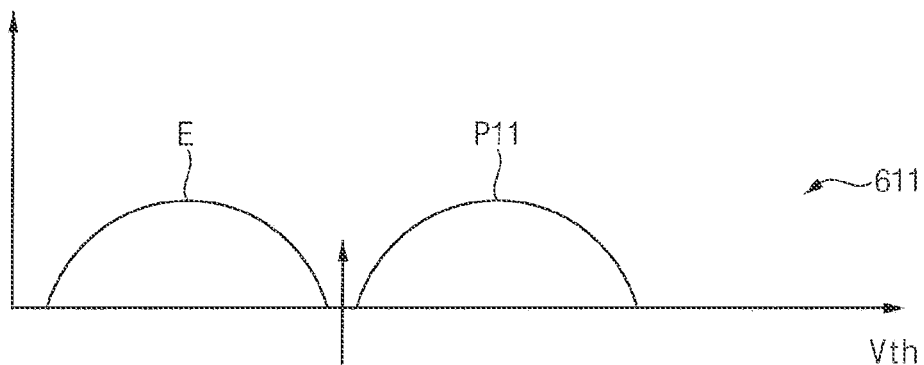
FIG. 16 illustrates threshold voltage distributions of single-level cells (SLC)s and threshold voltage distributions of triple-level cells (TLC)s.
Figure 16:
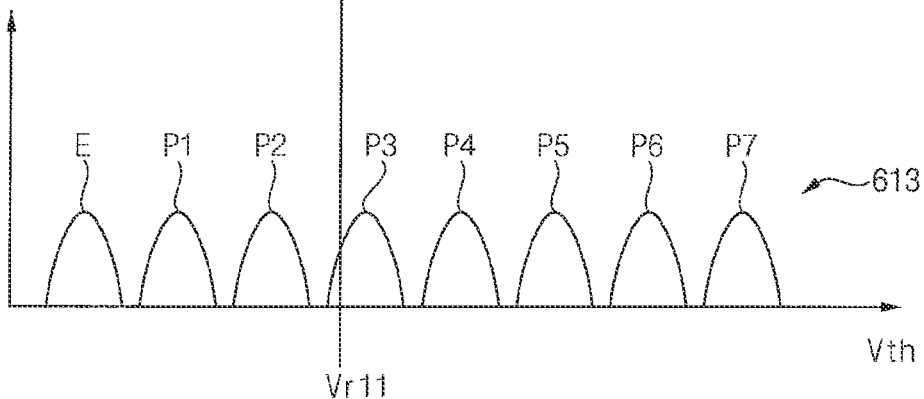

FIG. 16 illustrates threshold voltage distributions of single-level cells (SLC)s and threshold voltage distributions of triple-level cells (TLC)s.

In FIG. 16, a reference numeral 611 illustrates threshold voltage distributions of SLCs including an erase state E and a first program state P11 and a reference numeral 613 illustrates threshold voltage distributions of TLCs including an erase state E and first through seventh program state P1, P2, P3, P4, P5, P6 and P7.

In FIG. 16, when a first read voltage Vr11 for discriminating between the erase state E and the first program state P11 of the SLCs is used to discriminate between the second program state P2 and the third program state P3 of the TLCs, many errors may occur in reading the TLCs.

Figure 17:
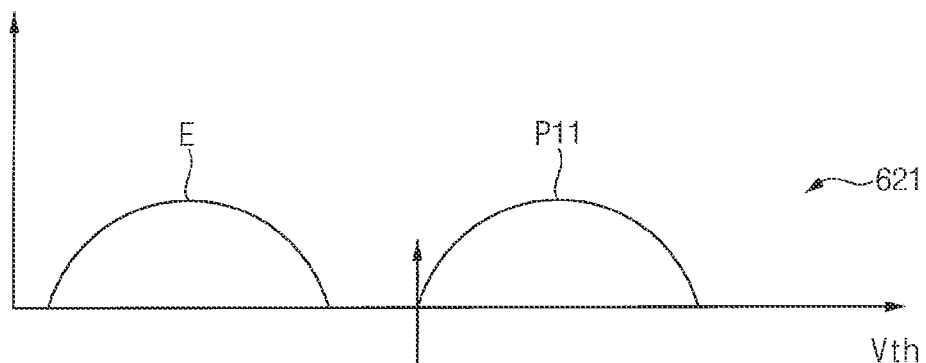
FIG. 17 illustrates threshold voltage distributions of SLCs and threshold voltage distributions of TLCs.
Figure 17:
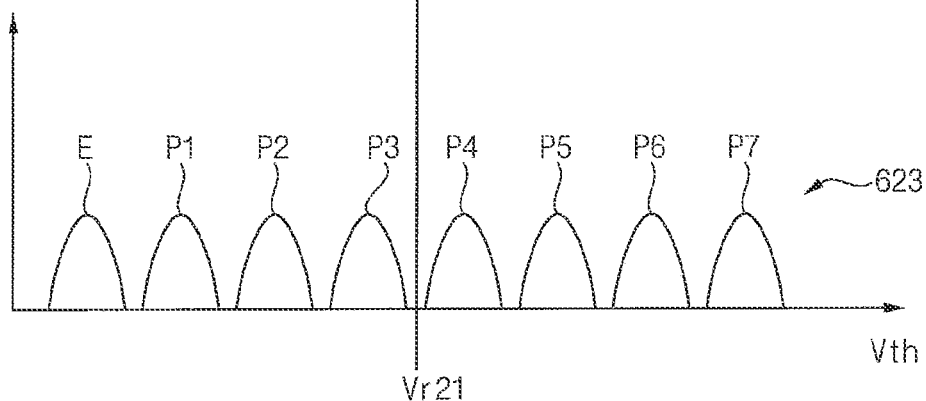

FIG. 17 illustrates threshold voltage distributions of SLCs and threshold voltage distributions of TLCs.

In FIG. 17, a reference numeral 621 illustrates threshold voltage distributions of SLCs including an erase state E and a first program state P11 and a reference numeral 623 illustrates threshold voltage distributions of TLCs including an erase state E and first through seventh program state P1, P2, P3, P4, P5, P6 and P7.

In FIG. 17, when a first read voltage Vr21 that discriminates between the erase state E and the first program state P11 of the SLCs is used to discriminate between the third program state P3 and the fourth program state P4 of the TLCs, errors should not occur in reading the TLCs. For reducing errors in reading the TLCs, the threshold voltage distributions of TLCs may be aligned with the threshold voltage distributions of SLCs in programming the TLCs or a level of the first read voltage Vr21 may be adjusted such that at least one of the threshold voltage distributions of SLCs and at least one of the threshold voltage distributions of TLCs are discriminated by a same read voltage. That is, the program manager 500 or the control circuit 460 may adjust the level of the first read voltage Vr21 such that at least one of the threshold voltage distributions of the outer cells and at least one of the threshold voltage distributions of the inner cells are discriminated by a same read voltage.

Figure 18:
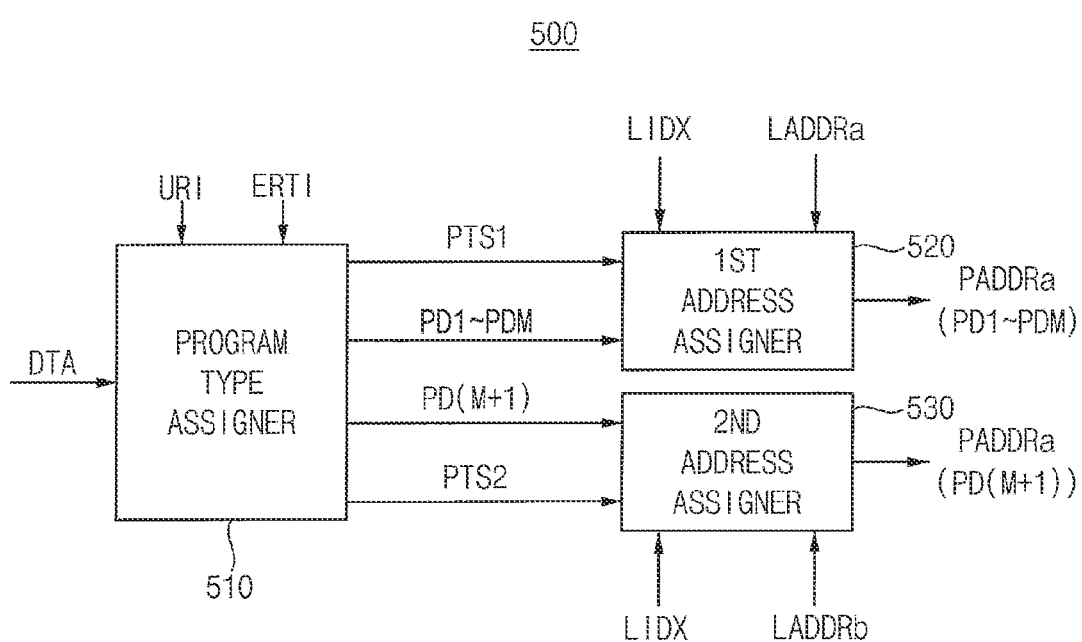
FIG. 18 is a block diagram of a program manager in the storage controller of FIG. 3 according to an example embodiment.

FIG. 18 is a block diagram of a program manager in the storage controller of FIG. 3 according to an example embodiment.

Referring to FIG. 18, the program manager 500 may include a program type assigner 510, a first address assigner 520 and a second address assigner 530.

The program manger 500 may assign a program operation associated with the data DTA, to be performed on target memory cells in each of the nonvolatile memory devices 400a to 400k, to one of a first program operation and a second program operation based on excepted retention time information ETRI of the data DTA and user request information URI on the data DTA, may assign the data DTA (program data) to first through M-th page data PD1 to PDM and a (M+1)-th page data PD(M+1), may provide the first address assigner 520 with a first program type signal PTS1 indicating that the program operation is assigned to the first program operation, and may provide the second address assigner 530 with a second program type signal PTS2 indicating that the program operation is assigned to the second program operation.

The excepted retention time information ETRI may correspond to an expected storing time associated with the data DTA to be programmed and the user request information URI may include performance, latency associated with the program operation and reliability associated with the data DTA to be programmed.

The first address assigner 520 may receive the first program type signal PTS1 and the first through M-th page data PD1 to PDM, may assign a logical address LADDRa of the target word-line to a physical address PADDRa based on the location index LIDX and may provide the physical address PADDRa and the first through M-th page data PD1 to PDM to the nonvolatile memory device 400a through the memory interface 370.

The second address assigner 530 may receive the second program type signal PTS2 and the (M+1)-th page data PD(M+1), may assign a logical address LADDRb of the target word-line to the physical address PADDRa based on the location index LIDX and may provide the physical address PADDRa and the (M+1)-th page data PD(M+1) to the nonvolatile memory device 400a through the memory interface 370.

Here, the first program operation may correspond to a TLC program operation to program memory cells of a first memory block to have an erase state and first through 2M−1 program states and the second program operation may correspond to a QLC program operation to program memory cells of a second memory block to have one of an erase state and first through 2M+1−1 program states.

Figure 19:
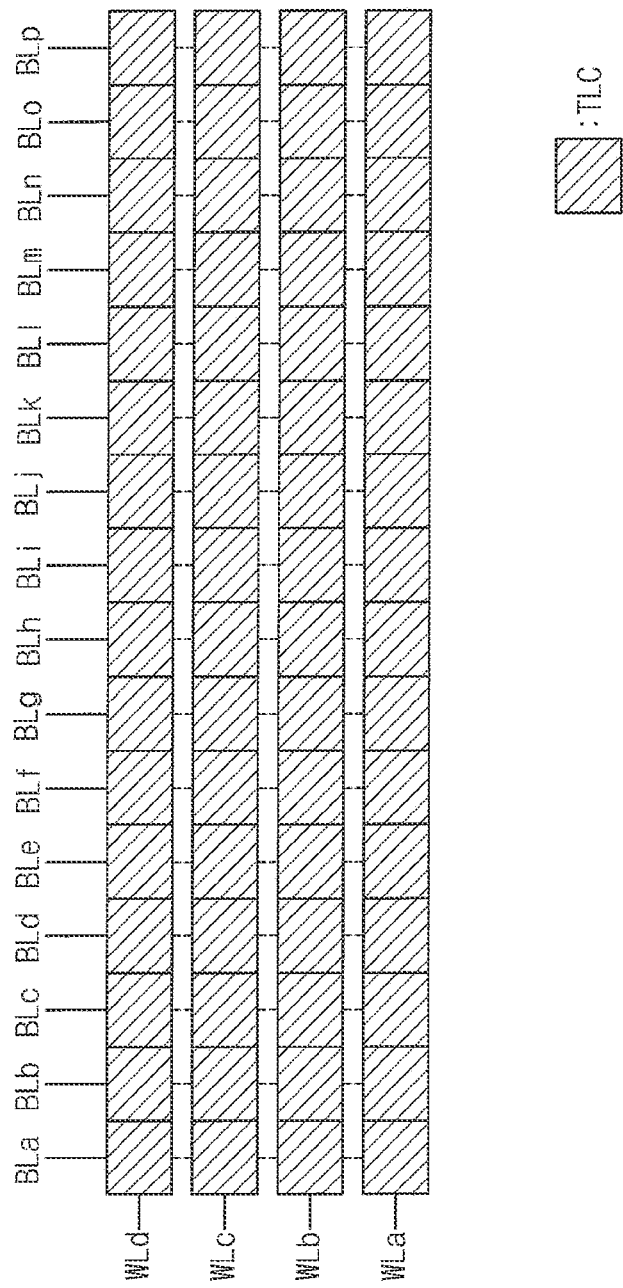
FIG. 19 illustrates that a first program operation is performed on a plurality of word-lines in the nonvolatile memory device of FIG. 5.

FIG. 19 illustrates that a first program operation is performed on a plurality of word-lines in the nonvolatile memory device of FIG. 5.

Referring to FIG. 19, memory cells are coupled to a plurality of word-lines WLa, WLb, WLc and WLd and a plurality of bit-lines BLa, BLb, BLc, BLd, BLe, BLf, BLg, BLh, BLi, BLj, BLk, BLl, BLm, BLn, BLo and BLp. The first program operation is sequentially performed on the memory cells word-line by word-lines and each of the memory cells stores 3-bits. That is each of the memory cells is a TLC.

Figure 20:
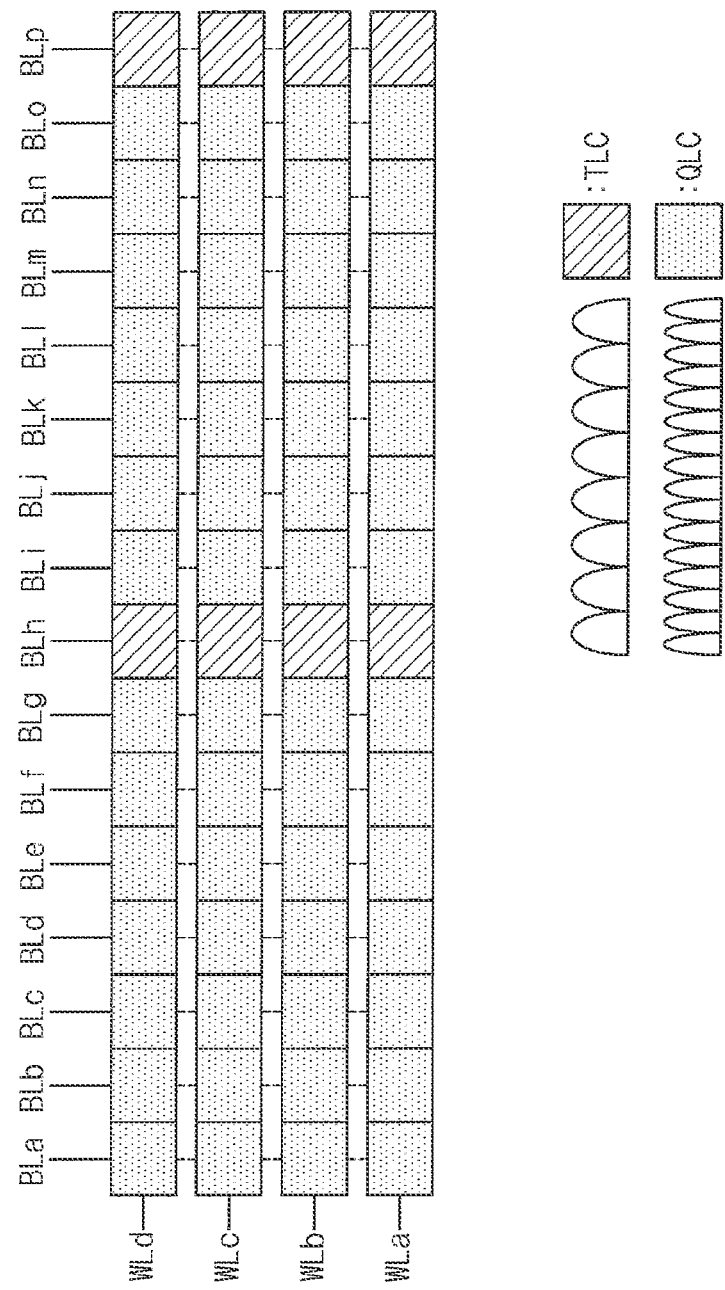
FIG. 20 illustrates that a second program operation is performed on a portion of the memory cells in FIG. 19.

FIG. 20 illustrates that a second program operation is performed on a portion of the memory cells in FIG. 19.

Referring to FIG. 20, a second program operation is performed on first memory cells coupled to plurality of word-lines WLa, WLb, WLc and WLd and the bit-lines BLa, BLb, BLc, BLd, BLe, BLf, BLg, BLi, BLj, BLk, BLl, BLm, BLn and BLo and each of the second memory cells stores 4-bits and the second program operation is not performed on second memory cells coupled to plurality of word-lines WLa, WLb, WLc and WLd and the bit-lines BLh and BLp. That is, each of the first memory cells is a QLC. A program inhibit voltage is applied to the bit-lines BLh and BLp when the second program operation is performed.

That is, the control circuit 460 may apply first bias voltages (a first program voltage to the word-lines, a program permission voltage to the bit-lines) to the word-lines WLa, WLb, WLc and WLd and the bit-lines BLa, BLb, BLc, BLd, BLe, BLf, BLg. BLh, BLi, BLj, BLk, BLl, BLm, BLn, BLo and BLp such that each of the memory cells coupled to the word-lines WLa, WLb, WLc and WLd and the bit-lines BLa, BLb, BLc, BLd, BLe, BLf, BLg. BLh, BLi, BLj, BLk, BLl, BLm, BLn, BLo and BLp stores a first number of bits (i.e., 3-bits) in the first program operation. The control circuit 460 may apply second bias voltages (a second program voltage whose level is greater than the first program voltage to the word-lines, a program inhibit voltage to the bit-lines BLh and BLp and a program permission voltage to the bit-lines BLa, BLb, BLc, BLd, BLe, BLf, BLg, BLi, BLj, BLk, BLl, BLm, BLn and BLo) to the word-lines WLa, WLb, WLc and WLd and the bit-lines BLa, BLb, BLc, BLd, BLe, BLf, BLg, BLi, BLj, BLk, BLl, BLm, BLn and BLo such that each of memory cells coupled to the word-lines WLa, WLb, WLc and WLd and the bit-lines BLa, BLb, BLc, BLd, BLe, BLf, BLg, BLi, BLj. BLk, BLl, BLm, BLn and BLo stores a second number of bits (i.e., 4-bits). The memory cells coupled to the WLa, WLb, WLc and WLd and the bit-lines BLh and BLp may correspond to the outer cells. The memory cells coupled to the word-lines WLa, WLb, WLc and WLd and the bit-lines BLa, BLb, BLc, BLd, BLe, BLf, BLg, BLi, BLj, BLk, BLl, BLm, BLn and BLo may correspond to the inner cells.

Figure 21:
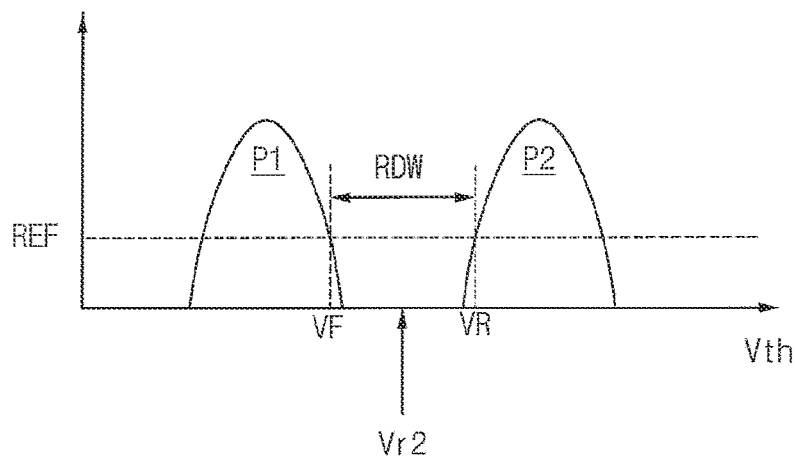
FIG. 21 is a graph showing enlarged first and second program states of FIG. 13A.

FIG. 21 is a graph showing enlarged first and second program states of FIG. 13A.

Referring to FIG. 21, a read window RDW between the first and second program states P1 and P2 may be defined as a difference between a fall voltage VF corresponding to the first program state P1 and a rise voltage VR corresponding to the second program state P2. Here, the fall voltage VF may represent a threshold voltage where the number of "off" cells corresponds to a reference number REF, based on an "off" cell count result for memory cells programmed to the first program state P1. The rise voltage VR may represent a threshold voltage where the number of "off" cells corresponds to the reference number REF, based on an "off" cell count result for memory cells programmed to the second program state P2. A read voltage Vr2 for determining the second program state P2 should have a voltage level within the read window RDW, and in order to decrease a read error, the read window RDW should be sufficiently widely secured.

Figure 22:
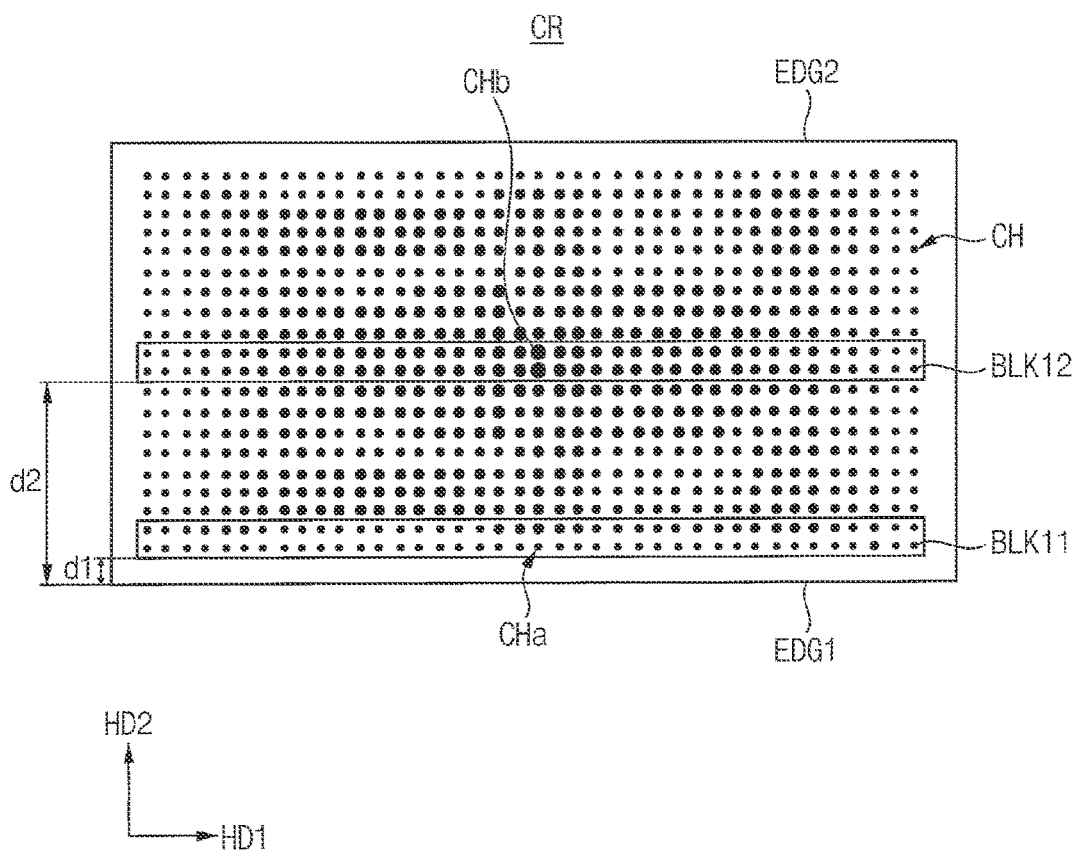
FIG. 22 illustrates a cell region in which the memory cell array of FIG. 6 is formed according to an example embodiment.

FIG. 22 illustrates a cell region in which the memory cell array of FIG. 6 is formed according to an example embodiment.

Referring to FIG. 22, a cell region CR includes a plurality of channel holes CH.

A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLK11 may be adjacent to the first edge EDG1, and may be spaced apart from the first edge EDG1 by a first distance d1. A memory block BLK12 is not adjacent to the first and second edges EDG1 and EDG2, and may be in a center of the cell region CR, and may be spaced apart from the first edge EDG1 by a second distance d2. In an embodiment, the second distance d2 is greater than the first distance d1. In an embodiment, a first diameter D1 of a first channel hole CHa included in the memory block BLK11 may be smaller than a second diameter D2 of a second channel hole CHb included in the memory block BLK12.

Figure 23A:
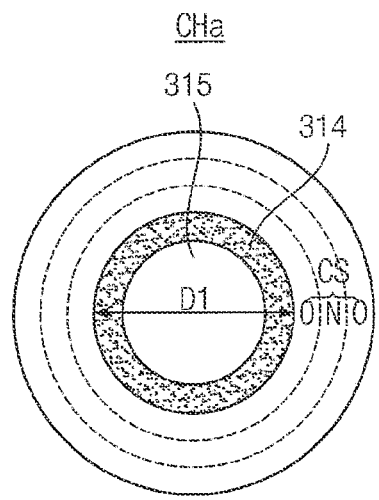
FIGS. 23A and 23B illustrate cross-sections of strings of the memory blocks of FIG. 21, respectively.
Figure 23B:
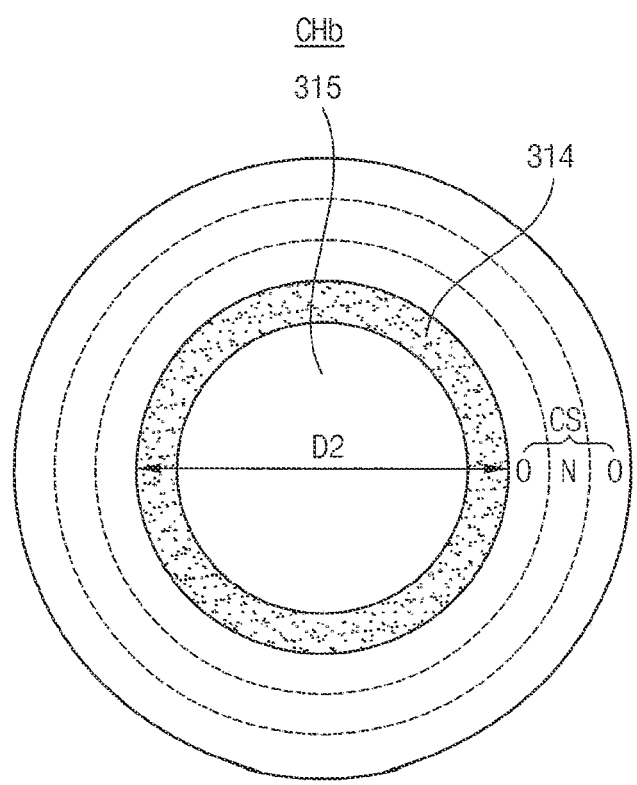

FIGS. 23A and 23B illustrate cross-sections of strings of the memory blocks BLK11 and BLK12 of FIG. 21, respectively.

Referring to FIG. 23A, a pillar including a channel layer 314 and an internal layer 315 may be formed in the first channel hole CHa included in the memory block BLK11, and a charge storage layer CS may be formed around the first channel hole CHa, and the charge storage layer CS may have an (oxide-nitride-oxide) ONO structure.

Referring to FIG. 23B, a pillar including a channel layer 314 and an internal layer 315 may be formed in the second channel hole CHb included in the memory block BLK12, and a charge storage layer CS may be formed around the second channel hole CHb, and the charge storage layer CS may have an ONO structure.

In an example embodiment, a thickness of the charge storage layer CS included in the memory block BLK12 is different from a thickness of the charge storage layer CS included in the memory block BLK11. Characteristics of memory cells may vary due to the difference in the channel hole diameters. For example, in a NAND flash nonvolatile memory device having a gate all around structure in which a gate electrode is disposed around a circumference of a channel hole, if a channel hole diameter is reduced, the magnitude of an electric field formed between a gate electrode and a channel layer 314 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 22, a memory block is formed in the cell region CR to include all memory cells corresponding to one page in the first horizontal direction HD1, that is, in a word-line direction, and to include some strings in the second horizontal direction HD2, that is, in a bit-line direction. Thus, each memory block extends in the first horizontal direction HD1, and channel hole sizes, that is, channel hole diameters may differ in units of memory blocks. Thus, program and erase speeds of memory cells included in the memory block BLK11 may be higher than program and erase speeds of memory cells included in the memory block BLK12.

Figure 24:
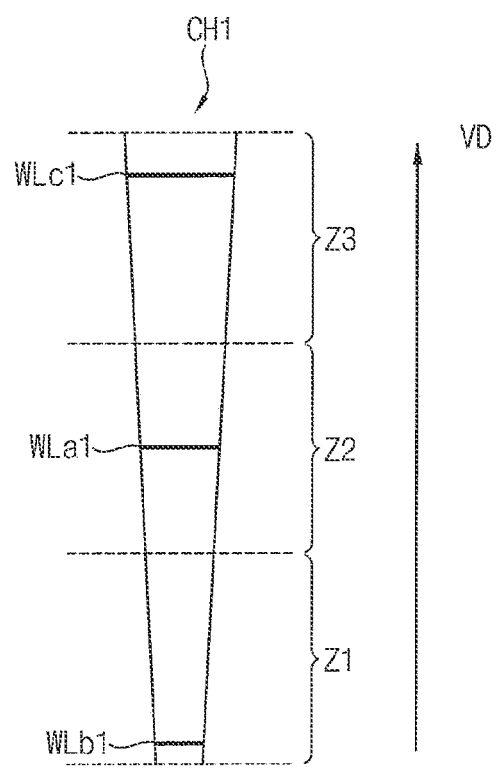
FIG. 24 illustrates an example of a vertical structure of one of the channel holes in FIG. 22.

FIG. 24 illustrates an example of a vertical structure of one of the channel holes in FIG. 22.

Referring to FIG. 24, a channel hole CH1 corresponding to a string included in a nonvolatile memory device is illustrated. As described above, the channel hole CH1 is formed by etching portions of gate electrodes and insulation layers stacked on a substrate, and thus, the channel hole CH1 may have a tapered etching profile where a diameter of the channel hole CH1 becomes downwardly smaller. Thus, a diameter of the channel hole CH1 may be smaller towards the substrate.

In an example embodiment, the channel hole CH1 may be divided into three zones according to channel hole diameters. For example, a zone in which a channel hole diameter is smaller than a first value may be referred to as a first zone Z1, and a zone in which a channel hole diameter is equal to or greater than the first value and smaller than a second value may be referred to as a second zone Z2, and a zone in which a channel hole diameter is equal to or greater than the second value and smaller than a third value may be referred to as a third zone Z3. Therefore, characteristic of memory cells included in one channel hole may be different according to positions along the vertical direction VD.

A word-line WLb1 is provided in the first zone Z1, a word-line Wla1 is provided in the second zone Z2, and a word-line WLc1 is provided in the third zone Z3. Because the word-line WLb1 is adjacent to a lower edge of the channel hole CH1, the word-line WLb1 is adjacent to a ground selection line or the substrate, a bridge may occur between the word-line WLb1 and the channel. When the bridge occurs between the word-line WLb and the channel, a current leakage may occur through the bridge and a program/read operation or an erase operation may operate abnormally in the word-line WLb1 due to the bridge.

Because the word-line WLc1 is adjacent to an upper edge of the channel hole CH1, the word-line WLc1 is adjacent to a string selection line or the substrate, a bridge may occur between the word-line WLc1 and the channel.

Error occurrence probability of pages coupled to the word-line WLc1 which is adjacent to an upper edge of the channel hole CH1 or coupled to the word-line WLb1 which is adjacent to the lower edge of the channel hole CH1 may be greater than error occurrence probability of pages coupled to the word-line Wla1 which is disposed at a center region of the channel hole CH1.

FIGS. 21 through 24 relate to embodiments in which an error attribute of the target page may be different based on a location of the target word-line and error occurrence probability of the target page may be different based on the error attribute.

The processor 310 in the storage controller 300 according to an example embodiment, may assign different location indices to the plurality of NAND strings, respectively. In addition, the processor 310 may apply the same location index to at least two NAND strings sharing a same channel hole from among the plurality of channel holes, from among the plurality of NAND strings. In addition, the processor 310 may assign individual location indices to the plurality of memory blocks, respectively. In addition, the processor 310 may assign the location index to at least one word-line or a portion of word-lines including the inner cells and outer cells having a different error occurrence probability.

Figure 25:
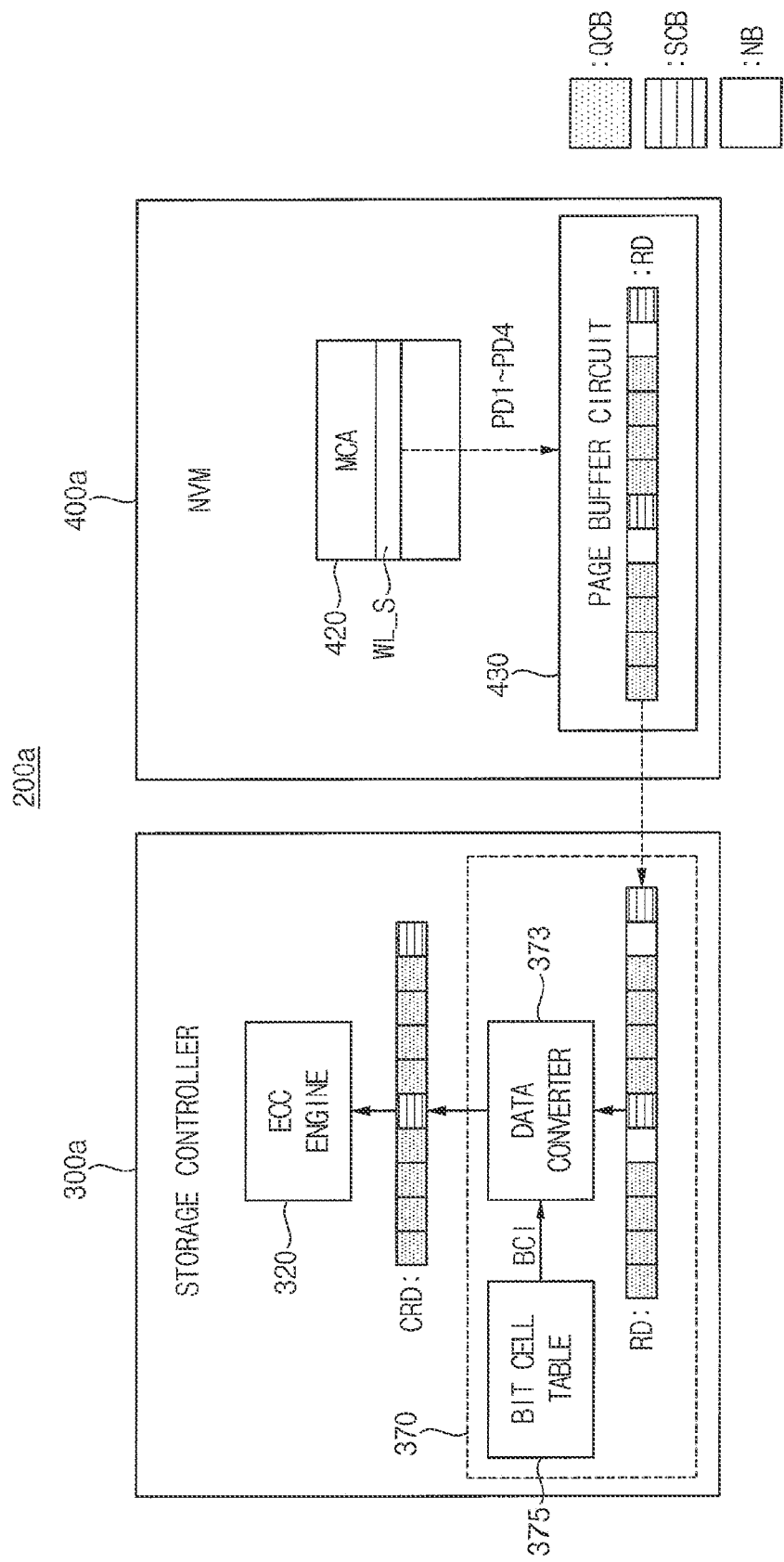
FIG. 25 is a block diagram of a storage device according to an example embodiments.

FIG. 25 is a block diagram of a storage device according to an example embodiment.

Referring to FIG. 25, a storage device 200a may include a storage controller 300a and a nonvolatile memory device 400a.

The storage controller 300a may include an ECC engine 320 and a memory interface 370 and the memory interface 370 may include a bit cell table 375 and a data converter 373. The nonvolatile memory device 400a may include a memory cell array 420 and a page buffer circuit 430.

During a read operation on a target word-line WL_S of the nonvolatile memory device 400a, first through fourth page data PD1~PD4 read from the target word-line WL_S may be temporarily stored in the page buffer circuit 430 as a read data RD. The read data RD may include QCBs read from the QLCs, SCB read from the SLCs and null bits that do not include information. The nonvolatile memory device 400a may provide the read data RD stored in the page buffer circuit 430 to the memory interface 370 through the data I/O circuit (440 in FIG. 5).

The data converter 373 in the memory interface 370 may generate a converted read data CRD by removing null bits NB in the read data read based on bit cell information BCI provided from the bit cell table 375 and may provide the converted read data CRD to the ECC engine 320. The ECC engine 320 may perform ECC decoding on the converted read data CRD to correct errors in the converted read data CRD.

Figure 26:
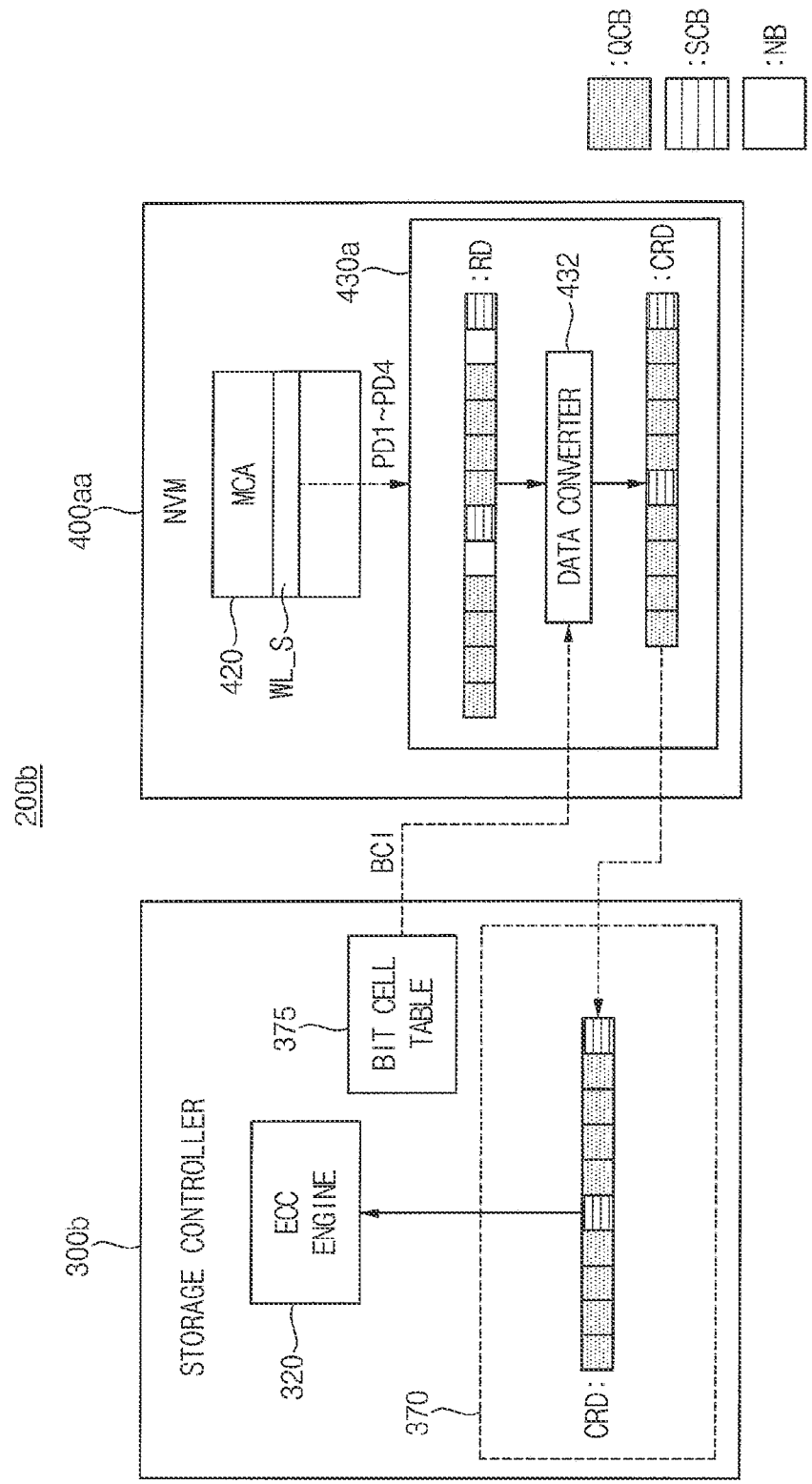
FIG. 26 is a block diagram of a storage device according to an example embodiment.

FIG. 26 is a block diagram of a storage device according to example embodiments.

Referring to FIG. 26, a storage device 200b may include a storage controller 300b and a nonvolatile memory device 400aa.

The storage controller 300b may include an ECC engine 320 and a memory interface 370 and may store a bit cell table 375. The nonvolatile memory device 400a may include a memory cell array 420 and a page buffer circuit 430a. The page buffer circuit 430a may include a data converter 432.

During a read operation on a target word-line WL_S of the nonvolatile memory device 400a, first through fourth page data PD1~PD4 read from the target word-line WL_S may be temporarily stored in the page buffer circuit 430 as a read data RD. The read data RD may include QCBs read from the QLCs, SCB read from the SLCs and null bits that do not include information. The data converter 432 may generate a converted read data CRD by removing null bits NB in the read data read based on bit cell information BCI provided from the bit cell table 375. The nonvolatile memory device 400a may provide the converted read data CRD to the memory interface 370 through the data I/O circuit (440 in FIG. 5).

The memory interface 370 may provide the converted read data CRD to the ECC engine 320. The ECC engine 320 may perform ECC decoding on the converted read data CRD to correct errors in the converted read data CRD.

Figure 27A:
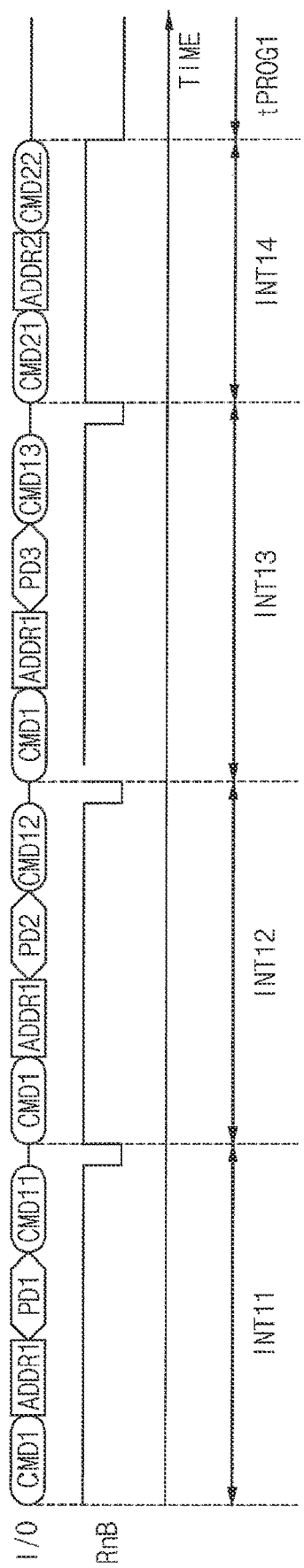
FIGS. 27A and 27B are timing diagrams for describing a program operation of the storage device according to an example embodiment.
Figure 27B:
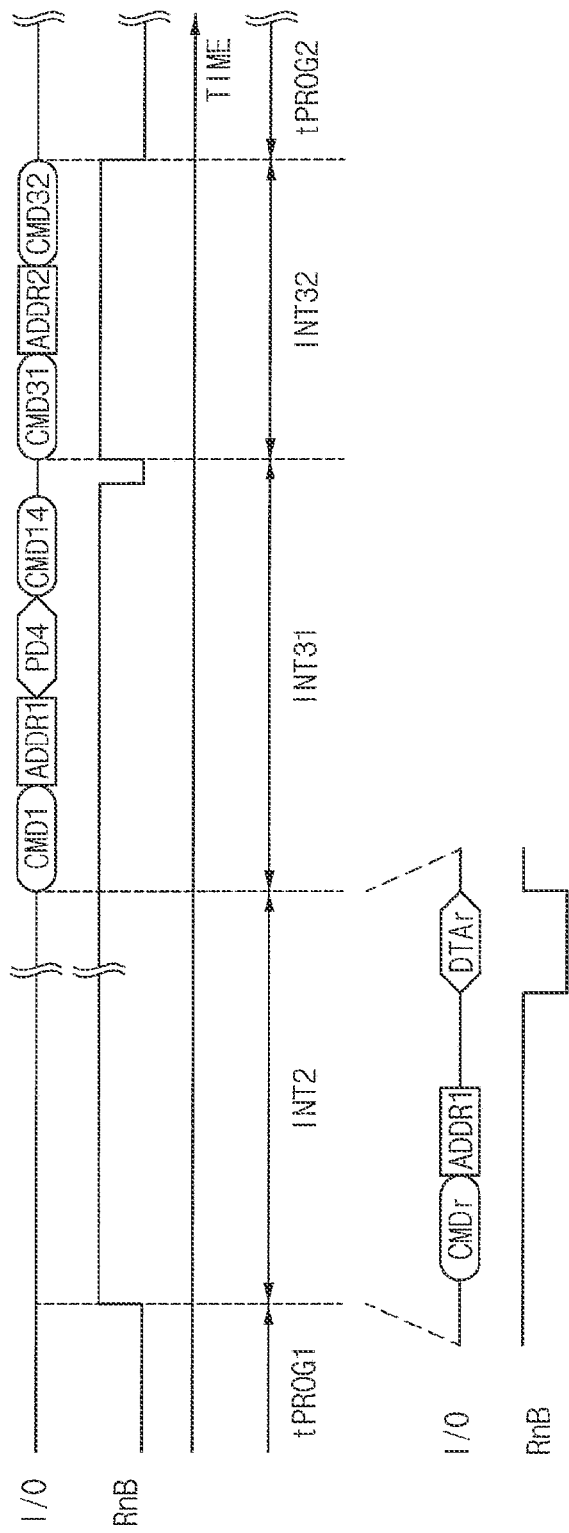

FIGS. 27A and 27B are timing diagrams for describing a program operation of the storage device according to an example embodiment.

Referring to FIGS. 4, 27A and 27B, the nonvolatile memory device 400a may receive the first through third page data PD1, PD2 and PD3 from the storage controller 300. During an interval INT11, the nonvolatile memory device 400a may receive a command CMD1, a first address ADDR1, the first page data PD1, and a command CMD11 through I/O lines. The commands CMD1 and CMD11 may be a command set for setting up the first page data PD1. The nonvolatile memory device 400a may dump (e.g., transfer) the first page data PD1 in response to the command CMD11 and a status signal RnB may be in a busy state while the first page data PD1 is dumped.

During an interval INT12, the nonvolatile memory device 400a may receive the command CMD1, the first address ADDR1, the second page data PD2, and a command CMD12 through the I/O lines. The commands CMD1 and CMD12 may be a command set for setting up the second page data PD2. The nonvolatile memory device 400a may dump (e.g., transfer) the second page data PD2 in response to the command CMD12 and the status signal RnB may be in a busy state while the second page data PD2 is dumped.

During an interval INT13, the nonvolatile memory device 400a may receive the command CMD1, the first address ADDR1, the third page data PD3, and a command CMD13 through the I/O lines. The commands CMD1 and CMD13 may be a command set for setting up the third page data PD3. The nonvolatile memory device 400a may dump (e.g., transfer) the third page data PD3 in response to the command CMD13 and the status signal RnB may be in a busy state while the third page data PD3 is dumped.

During an interval INT14, the nonvolatile memory device 400a may receive a command CMD21 and the second address ADDR2, and a command CMD22 through the I/O lines. The commands CMD1 and CMD22 may be a command set for initiating a program operation. The second address ADDR2 may include information about a program order.

During a program time tPROG1, the nonvolatile memory device 400a may perform a first program operation to program the first, second, and third page data PD1, PD2, and PD3 in response to the command CMD22. During the program time tPROG1, the status signal RnB may be in a busy state (i.e., in a low state).

An interval INT2 may elapse after the first program operation has completed. During the interval INT2, the nonvolatile memory device 400a may receive a read command CMDr and the first address ADDR1, may read the first, second, and third pages PD1, PD2, and PD3 from the memory cell array 420 in response to the read command CMDr as a read data DTAr and may provide the CMDr to the storage controller 300. During the read data DTAr are read from the memory cell array 420 the status signal RnB may be in a busy state (i.e., in a low state).

During an interval INT31, the nonvolatile memory device 400a may receive the command CMD1, the first address ADDR1, the fourth page data PD4, and a command CMD14 through the I/O lines. The commands CMD1 and CMD14 may be a command set for setting up the fourth page data PD4. The nonvolatile memory device 400a may dump (e.g., transfer) the fourth page data PD4 in response to the command CMD14 and the status signal RnB may be in a busy state while the fourth page data PD4 is dumped.

During an interval INT32, the nonvolatile memory device 400a may receive a command CMD31 and the second ADDR2, and a command CMD32 through the I/O lines. The commands CMD31 and CMD32 may be a command set for initiating a program operation. The second address ADDR2 may include information about a program order.

During a program time tPROG2, the nonvolatile memory device 400a may perform a second program operation to program the fourth page data PD4 in response to the command CMD32. During the program time tPROG2, the status signal RnB may be in a busy state (i.e., in a low state).

Figure 28:
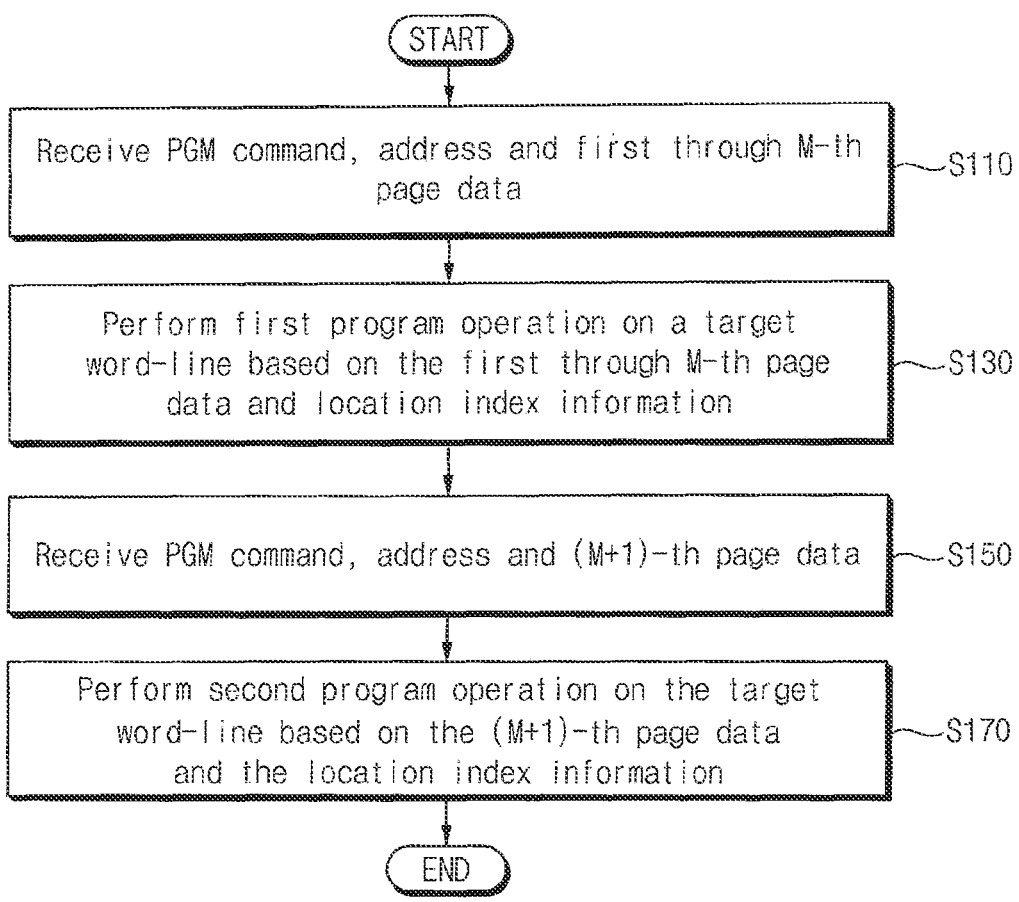
FIG. 28 is a flow chart illustrating a method of operating a storage device according to an example embodiment.

FIG. 28 is a flow chart illustrating a method of operating a storage device according to an example embodiment.

Referring to FIGS. 3 through 24, there is provided a method of operating a nonvolatile memory device 400a which includes a memory cell array, where the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks.

According to the method, the nonvolatile memory device 400a receives a first program command (e.g., a PGM command), a physical address and first through M-th page data PD1 to PDM from a storage controller (operation S110).

The nonvolatile memory device 400a performs a first program operation on a first memory block of the memory cell array based on the first through M-th page data PD1 to PDM such that memory cells of a target word-line designated by the physical address have an erase state and first through $2^M-1$-th target program states (operation S130). Location index information may indicate the physical address.

After a reference time interval elapses from completion of the first program operation, the nonvolatile memory device 400a receives a second program command, the physical address and a (M+1)-th page data PD(M+1) from the storage controller (operation S150).

The nonvolatile memory device 400a performs a second program operation on the first memory block based on the (M+1)-th page data PD(M+1) such that a portion of the memory cells of the target word-line have an erase state and first through $2^{M+1}-1$-th target program states (operation S170).

The first program operation may correspond to a TLC program operation and the second program operation may correspond to a QLC program operation.

Therefore, the nonvolatile memory device and the storage device may group memory cells coupled to target word-lines into outer cells and inner cells based on a relative distance from a word-line cut region to the memory cells and program different numbers of bits in the outer cells and the inner cells. Accordingly, the nonvolatile memory device and the storage device may reduce degradation due to a difference of threshold voltage distributions between the outer cells and the inner cells.

Figure 29:
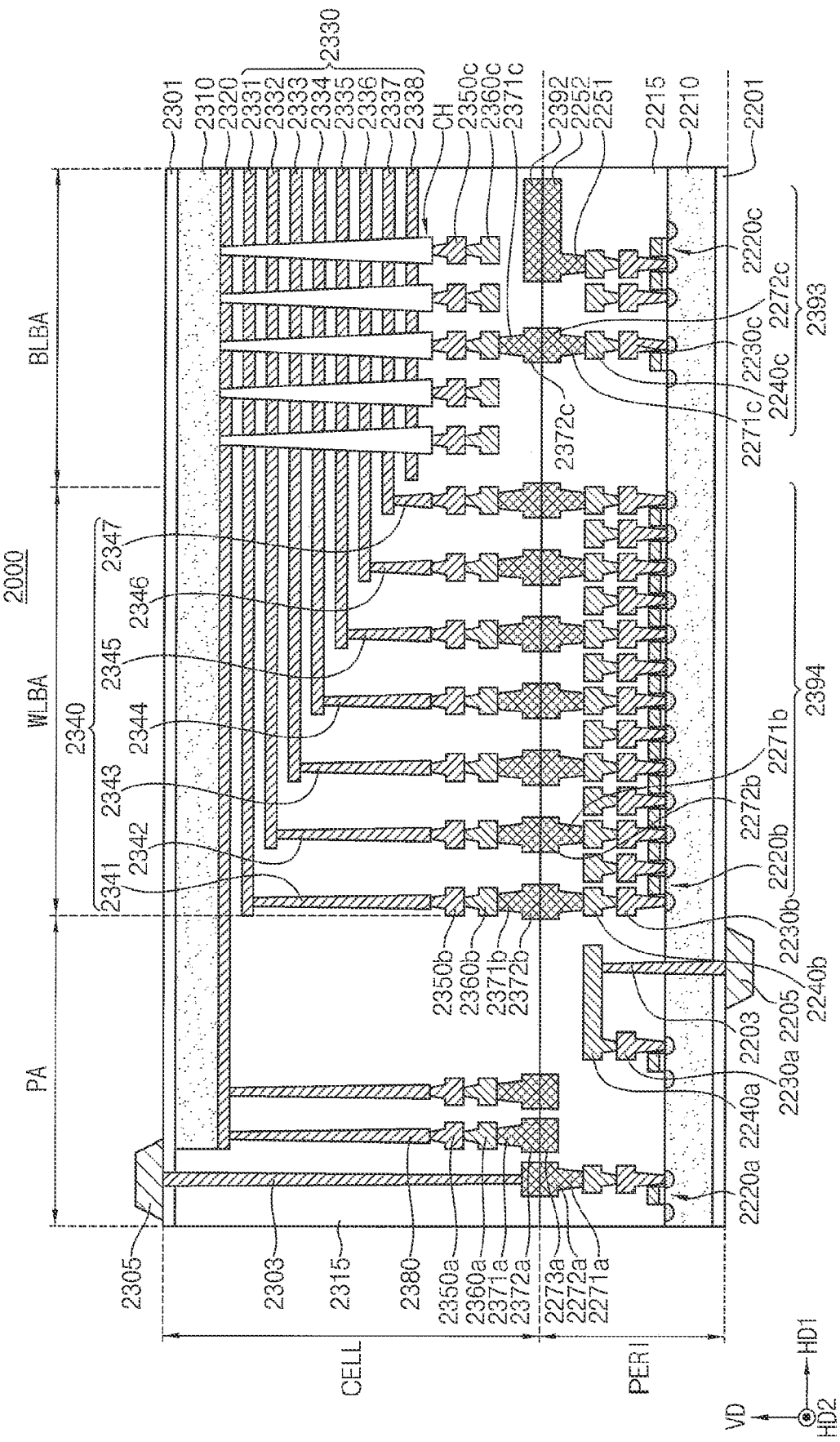
FIG. 29 is a cross-sectional view of a nonvolatile memory device according to an example embodiment.

FIG. 29 is a cross-sectional view of a nonvolatile memory device according to an example embodiment.

Referring to FIG. 29, a nonvolatile memory device 2000, which may be referred to as a memory device, may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, is not limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrated in FIG. 29, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The least one memory block may include a first region and a second region. The first region may store compensation data set and may correspond to SLC block. The cell region CELL may include a second substrate 2310 and a common source line 2320. On the second substrate

2310, a plurality of word-lines 2330, which may include word-line 2331, word-line 2332, word-line 2333, word-line 2334, word-line 2335, word-line 2336, word-line 2337, and word-line 2338 may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer and a second metal layer. For example, the first metal layer may be a bit-line contact 2350c, and the second metal layer may be a bit-line 2360c. In an example embodiment, the bit-line 2360c may extend in a second horizontal direction HD2 (e.g., a Y-axis direction), parallel to the upper surface of the second substrate 2310.

In an example embodiment illustrated in FIG. 29, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer circuit 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer circuit 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2340, which may include cell contact plug 2341, cell contact plug 2342, cell contact plug 2343, cell contact plug 2344, cell contact plug 2345, cell contact plug 2346, and cell contact plug 2347. The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming an address decoder 2394 in the peripheral circuit region PERI. In an example embodiment, operating voltages of the circuit elements 2220b forming the address decoder 2394 may be different than operating voltages of the circuit elements 2220c forming the page buffer circuit 2393. For example, operating voltages of the circuit elements 2220c forming the page buffer circuit 2393 may be greater than operating voltages of the circuit elements 2220b forming the address decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to an embodiment, the second substrate 2310 and the common source line 2320 are not disposed in an area in which the second input/output contact plug 2303 is disposed. Also, the second input/output pad 2305 may not overlap the word-lines 2330 in the vertical direction HD. The second input/output contact plug 2303 may be separated from the second substrate 2310 in the direction, parallel to the upper surface of the second substrate 2310, and may pass through the interlayer insulating layer 2315 of the cell region CELL to be connected to the second input/output pad 2305.

According to an embodiment, the first input/output pad 2205 and the second input/output pad 2305 are selectively formed. For example, the memory device 2000 may include only the first input/output pad 2205 disposed on the first substrate 2210 or the second input/output pad 2305 disposed on the second substrate 2310. In an embodiments, the storage device 200 includes both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372*a* of the cell region CELL so as to be connected to each other, in an uppermost metal layer of the peripheral circuit region PERI. In the external pad bonding area PA, the memory device 2000 may include lower bonding metals 2271*a* and 2271*b* connected to the lower metal pattern 2273*a*. In the peripheral circuit region PERI, the lower metal pattern 2273*a* formed in the uppermost metal layer of the peripheral circuit region PERI may not be connected to a contact. Similarly, in the external pad bonding area PA, an upper metal pattern 2372*a*, corresponding to the lower metal pattern 2273*a* formed in an uppermost metal layer of the peripheral circuit region PERI, and having the same shape as a lower metal pattern 2273*a* of the peripheral circuit region PERI, may be formed in an uppermost metal layer of the cell region CELL. Similarly, in the external pad bonding area PA, an upper bonding metal 2371*a* may be formed and may be electrically connected to the upper metal pattern 2372*a*. The upper metal pattern 2372*a* may be included in upper bonding metals 2371*a* and 2372*a*.

The lower bonding metals 2271*b* and 2272*b* may be formed on the second metal layer 2240*b* in the word-line bonding area WLBA. In the word-line bonding area WLBA, the lower bonding metals 2271*b* and 2272*b* of the peripheral circuit region PERI may be electrically connected to the upper bonding metals 2371*b* and 2372*b* of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL. The lower metal pattern 2252 may be included in lower bonding metals 2251 and 2252.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. In an embodiment, a contact is not formed on the reinforcement metal pattern.

The word-line voltages may be applied to at least one memory block in the cell region CELL through the lower bonding metals 2271*b* and 2272*b* in the peripheral circuit region PERI and upper bonding metals 2371*b* and 2372*b* of the cell region CELL.

Figure 30:
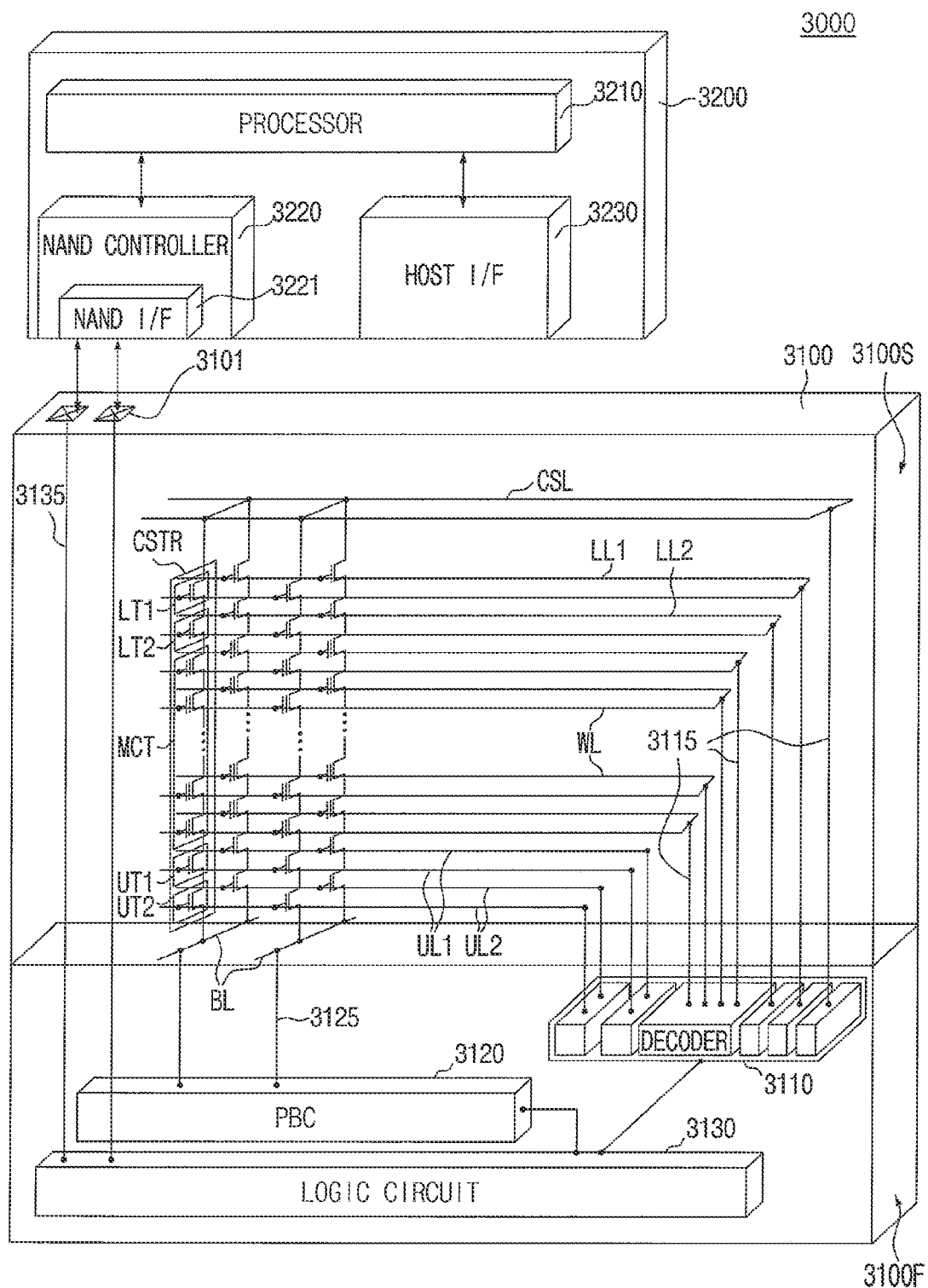
FIG. 30 is a block diagram illustrating an electronic system including a semiconductor device according to an example embodiment.

FIG. 30 is a block diagram illustrating an electronic system including a semiconductor device according to an example embodiment.

Referring to FIG. 30, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a nonvolatile memory device, for example, the nonvolatile memory device illustrated with reference to FIGS. 5 through 13D.

The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In an example embodiment, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to an example embodiment may be packaged using various package types or package configurations.

The present disclosure may be applied to various electronic devices including a nonvolatile memory device. For example, the present disclosures may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the disclosure. Accordingly, all such modifications are intended to be included within the scope of the disclosure as defined in the claims.

word-lines, a plurality of memory cells provided in a plurality of channel holes and a word-line cut region extending in a first horizontal direction and dividing the word-lines into a plurality of memory blocks. A plurality of target memory cells coupled to each of the plurality of word-lines are grouped into outer cells and inner cells based on a location index of each of the plurality of memory cells. The control circuit controls a program operation on target memory cells coupled to a target word-line of the plurality of word-lines such that each of the outer cells stores a first number of bits and each of the inner cells stores a second number of bits. The second number is a natural number greater than the first number.

What is claimed is:

1. A nonvolatile memory device comprising:
a memory cell array,
wherein the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks; and
a control circuit configured to control the memory cell array,
wherein a plurality of target memory cells coupled to each of the plurality of word-lines are grouped into outer cells and inner cells based on a location index of each of the plurality of memory cells, a distance between the outer cell and the word-line cut region being smaller than a distance between the inner cell and the word-line cut region, and
wherein the control circuit is configured to control performance of a program operation on target memory cells coupled to a target word-line of the plurality of word-lines such that each of the outer cells stores a first number of bits and each of the inner cells stores a second number of bits, the first number being a natural number greater than zero and the second number being a natural number greater than the first number, and
wherein the control circuit is configured to adjust levels of read voltages associated with a read operation performed on the target memory cell such that at least one of first threshold voltage distributions of the outer cells and at least one of second threshold voltage distributions of the inner cells are discriminated by a same read voltage,
wherein the same read voltage is between two states of the first threshold voltage distributions and between two states of the second threshold distributions.

2. The nonvolatile memory device of claim 1, wherein the control circuit is configured to:
apply first bias voltages to the target word-lines and bit-lines coupled to the target memory cells such that the each of the target memory cells stores the first number of bits; and
apply second bias voltages different from the first bias voltages to the target word-lines and the bit-lines such that the each of the inner cells stores the second number of bits.

3. The nonvolatile memory device of claim 2, wherein the control circuit is configured to:
apply a first program voltage to the target word-line and apply a program permission voltage to the bit-lines such that the each of the target memory cells stores the first number of bits; and
apply a second program voltage whose level is greater than the first program voltage to the target word-line, apply a program inhibit voltage to first bit-lines coupled to the outer cell from among the bit-lines and apply a program permission voltage to second bit-lines coupled to the inner cells from among the bit-lines such that the each of the inner cells stores the second number of bits.

4. The nonvolatile memory device of claim 1, wherein target memory cells are further grouped into mid cells which are adjacent to a string selection line cut region between the inner cells based on the location index, wherein the control circuit is configured to control the program operation such that each of the mid cells stores a third number of bits, and wherein the third number is a natural number greater than the first number and smaller than the second number.

5. The nonvolatile memory device of claim 1, wherein the control circuit is configured to control the program operation such that at least one of the first threshold voltage distributions of the outer cells is aligned with at least one of the second threshold voltage distributions of the inner cells.

6. The nonvolatile memory device of claim 1, wherein:
the target word-line includes a plurality of pages;
at least two of the plurality of pages store a different number of bits; and
at least one of the at least two of the plurality of pages includes a null bit.

7. The nonvolatile memory device of claim 6, further comprising a page buffer circuit coupled to the memory cell array through a plurality of bit-lines, wherein the page buffer circuit includes a data converter configured to read a plurality of page data stored in each of the plurality of pages in the read operation performed on the target memory cells and configured to generate converted read data by removing null data in the plurality of read page data, and wherein the page buffer circuit is configured to provide the converted read data to the storage controller through a data input/output circuit.

8. The nonvolatile memory device of claim 1, wherein the control circuit is configured to:
perform a first program operation such the outer cells and the inner cell have first through $2^{M-1-th}$ target program states based on first through M-th page data from a storage controller, M being a natural number greater than two; and
perform a second program operation such that the inner cell have first through $2^{M+1-1-th}$ target program states based on a (M+1)-th page data from the storage controller.

9. The nonvolatile memory of claim 8, wherein the control circuit is configured to perform the second program operation by applying a program inhibit voltage to first bit-lines coupled to the outer cell from among the bit-lines and applying a program permission voltage to second bit-lines coupled to the inner cells from among the bit-lines.

10. The nonvolatile memory of claim 1, further comprising:
a voltage generator configured to generate word-line voltages based on control signals;
an address decoder coupled to the memory cell array through the plurality of word-lines, the address decoder configured to transfer the word-line voltages to the memory cell array based on a row address; and
a page buffer circuit coupled to the memory cell array through a plurality of bit-lines,
wherein the memory cell array includes the plurality of memory blocks, and
wherein at least one of the plurality of memory blocks includes a plurality of NAND strings, and each of the plurality of NAND strings includes a plurality of memory cells stacked in the vertical direction.

11. A storage device comprising:
a nonvolatile memory device including a memory cell array, wherein the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks; and
a storage controller configured to control the nonvolatile memory device,
wherein the storage controller is configured to group a plurality of memory cells coupled to each of the plurality of word-lines into a first group of cells and a second groups of cells based on a location index, and includes a program manager,
wherein the program manager is configured to control performance of a program operation on target memory cells coupled to a target word-line of the plurality of word-lines such that each of the first group of cells stores a first number of bits and each of the second group of cells stores a second number of bits, the first number being a natural number greater than zero and the second number being a natural number greater than the first number, and
wherein the nonvolatile memory device is configured to adjust levels of read voltages associated with a read operation performed on the target memory cell such that at least one of first threshold voltage distributions of the first group of cells and at least one of second threshold voltage distributions of the second group of cells are discriminated by a same read voltage,
wherein the same read voltage is between two states of the first threshold voltage distributions and between two states of the second threshold distributions.

12. The storage device of claim 11, wherein the program manager is configured to:
assign the program operation to be performed on the target memory cells to one of a first program operation and a second program operation;
assign program data to first through M-th page data and a (M+1)-th page data, M being a natural number greater than two;
provide the first through M-th page data to the nonvolatile memory device through a memory interface; and
provide the (M+1)-th page data to the nonvolatile memory device through the memory interface after the first program operation has completed.

13. The storage device of claim 12, further comprising a buffer memory connected to the storage controller, wherein the buffer memory is configured to store the first through M-th page data, to be released after the first program operation has completed and to store the (M+1)-th page data.

14. The storage device of claim 11, wherein the nonvolatile memory device further includes a control circuit configured to control access of the memory cell array, and wherein the control circuit is configured to control the program operation such that each of the first group of cells stores a first number of bits and each of the second group of cells stores a second number of bits, the first number being a natural number greater than zero and the second number being a natural number greater than the first number.

15. The storage device of claim 14, wherein the control circuit is configured to:
apply first bias voltages to the target word-lines and bit-lines coupled to the target memory cells such that the each of the target memory cells stores the first number of bits; and
apply second bias voltages different from the first bias voltages to the target word-lines and the bit-lines such that the each of the second group of cells stores the second number of bits.

16. The storage device of claim 14, wherein the storage controller is further configured to divide the plurality of memory cells into a third group of cells which are adjacent to a string selection line cut region between the second group of cells based on the location index, and wherein the program manager is configured to control the program operation so that each of the third group of cells stores a third number of bits, and wherein the third number is a natural number greater than the first number and smaller than the second number.

17. The storage device 14, wherein:
the target word-line includes a plurality of pages;
at least two of the plurality of pages store a different number of bits; and
at least one of the at least two of the plurality of pages includes a null bit.

18. The storage device 14,
wherein the nonvolatile memory device further includes a page buffer circuit coupled to the memory cell array through a plurality of bit-lines,
wherein the page buffer circuit is configured to read a plurality of page data stored in each of the plurality of pages in the read operation on the target memory cells and configured to provide the plurality of read page data to the storage controller through the data input/output circuit, and wherein the storage controller further includes:
   a data converter configured to generate converted read data by removing the null data in the plurality of read page data; and
   an error correction code (ECC) engine configured to perform an ECC decoding on the converted read data.

19. The storage device 14, wherein the control circuit is configured to control the program operation so that at least one of the first threshold voltage distributions of the first group of cells is aligned with at least one of the second threshold voltage distributions of the second group of cells.

20. A nonvolatile memory device comprising:
a memory cell array, wherein the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks; and a control circuit configured to control the memory cell, wherein a plurality of target memory cells coupled to each of the plurality of word-lines are grouped into outer cells and inner cells based on a location index of each of the plurality of memory cells, a distance between the outer cell and the word-line cut region being smaller than a distance between the inner cell and the word-line cut region, and wherein the control circuit is configured to control performance of a program operation on target memory cells coupled to a target word-line of the plurality of word-lines such that each of the outer cells stores M bits and each of the inner cells stores (M+1) bits, M being a natural number greater than two, and wherein the control circuit is configured to adjust levels of read voltages associated with a read operation performed on the target memory cell such that at least one of first threshold voltage distributions of the outer cells and at least one of second threshold voltage distributions of the inner cells are discriminated by a same read voltage, wherein the same read voltage is between two states of the first threshold voltage distributions and between two states of the second threshold distributions.

\* \* \* \* \*